(12) United States Patent
More

(10) Patent No.: US 12,132,100 B2
(45) Date of Patent: *Oct. 29, 2024

(54) PROFILE CONTROL IN FORMING EPITAXY REGIONS FOR TRANSISTORS

(71) Applicant: Taiwan Semiconductor Manufacturing Co., Ltd., Hsinchu (TW)

(72) Inventor: Shahaji B. More, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/186,567

(22) Filed: Mar. 20, 2023

(65) Prior Publication Data

US 2023/0307223 A1 Sep. 28, 2023

Related U.S. Application Data

(63) Continuation of application No. 17/148,220, filed on Jan. 13, 2021, now Pat. No. 11,610,979.

(60) Provisional application No. 63/078,527, filed on Sep. 15, 2020, provisional application No. 63/065,299, filed on Aug. 13, 2020.

(51) Int. Cl.
| | |
|---|---|
| *H01L 29/66* | (2006.01) |
| *H01L 21/02* | (2006.01) |
| *H01L 21/8234* | (2006.01) |
| *H01L 25/18* | (2023.01) |
| *H01L 27/088* | (2006.01) |
| *H10B 10/00* | (2023.01) |

(52) U.S. Cl.
CPC .. *H01L 29/66795* (2013.01); *H01L 21/02008* (2013.01); *H01L 21/02532* (2013.01); *H01L 21/823431* (2013.01); *H01L 25/18* (2013.01); *H01L 27/0886* (2013.01); *H10B 10/12* (2023.02)

(58) Field of Classification Search
CPC ......... H01L 29/66795; H01L 21/02532; H01L 25/18; H01L 27/1104
See application file for complete search history.

(56) References Cited

U.S. PATENT DOCUMENTS

| | | | |
|---|---|---|---|
| 6,541,357 | B1 | 4/2003 | Inaba |
| 8,299,564 | B1 | 10/2012 | Wu et al. |
| 8,878,309 | B1 | 11/2014 | Hong |

(Continued)

FOREIGN PATENT DOCUMENTS

| | | |
|---|---|---|
| CN | 1797716 | 7/2006 |
| CN | 104425493 | 3/2015 |
| CN | 109585291 | 4/2019 |

*Primary Examiner* — Monica D Harrison
*Assistant Examiner* — Andre C Stevenson
(74) *Attorney, Agent, or Firm* — Slater Matsil, LLP

(57) ABSTRACT

A method includes etching a silicon layer in a wafer to form a first trench in a first device region and a second trench in a second device region, performing a pre-clean process on the silicon layer, performing a baking process on the wafer, and performing an epitaxy process to form a first silicon germanium region and a second silicon germanium region in the first trench and the second trench, respectively. The first silicon germanium region and the second silicon germanium region have a loading in a range between about 5 nm and about 30 nm.

20 Claims, 18 Drawing Sheets

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,324,792 B1 | 4/2016 | Cao et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 10,535,736 B2 | 1/2020 | More et al. |
| 11,233,123 B2 | 1/2022 | More |
| 11,610,979 B2 * | 3/2023 | More ............... H01L 21/823431 |
| 2009/0321882 A1 | 12/2009 | Park |
| 2013/0285143 A1 | 10/2013 | Oh et al. |
| 2014/0021583 A1 * | 1/2014 | Lo ........................... H01L 24/19 |
| | | 257/532 |
| 2015/0093844 A1 * | 4/2015 | Hsia ........................ H01L 33/60 |
| | | 438/33 |
| 2015/0270345 A1 | 9/2015 | Hwang |
| 2015/0279933 A1 | 10/2015 | Xiao |
| 2020/0006639 A1 | 1/2020 | Wu et al. |
| 2020/0075729 A1 | 3/2020 | Yen et al. |
| 2020/0098750 A1 | 3/2020 | Lin |

* cited by examiner

US 12,132,100 B2

PROFILE CONTROL IN FORMING EPITAXY REGIONS FOR TRANSISTORS

PRIORITY CLAIM AND CROSS-REFERENCE

This application is a continuation of U.S. patent application Ser. No. 17/148,220, filed Jan. 13, 2021, and entitled "Profile Control in Forming Epitaxy Regions for Transistors," which claims the benefit of the U.S. Provisional Application No. 63/078,527, filed Sep. 15, 2020, and entitled "PFSC EPI Profile to Control Fin Width" and U.S. Provisional Application No. 63/065,299, filed Aug. 13, 2020, and entitled "PFSC EPI Profile to Control Fin Width," which applications are hereby incorporated herein by reference.

BACKGROUND

In the formation of integrated circuits, semiconductor regions may be patterned to form semiconductor fins, which are used for forming Fin Field-Effect Transistors (FinFETs). The semiconductor regions may include silicon regions or silicon germanium regions. To reduce the waste in chip area and the degradation in performance, the interface of the silicon regions or silicon germanium regions need to be clear with minimized transition regions. In addition, the heights of the semiconductor fins need to be controlled well.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
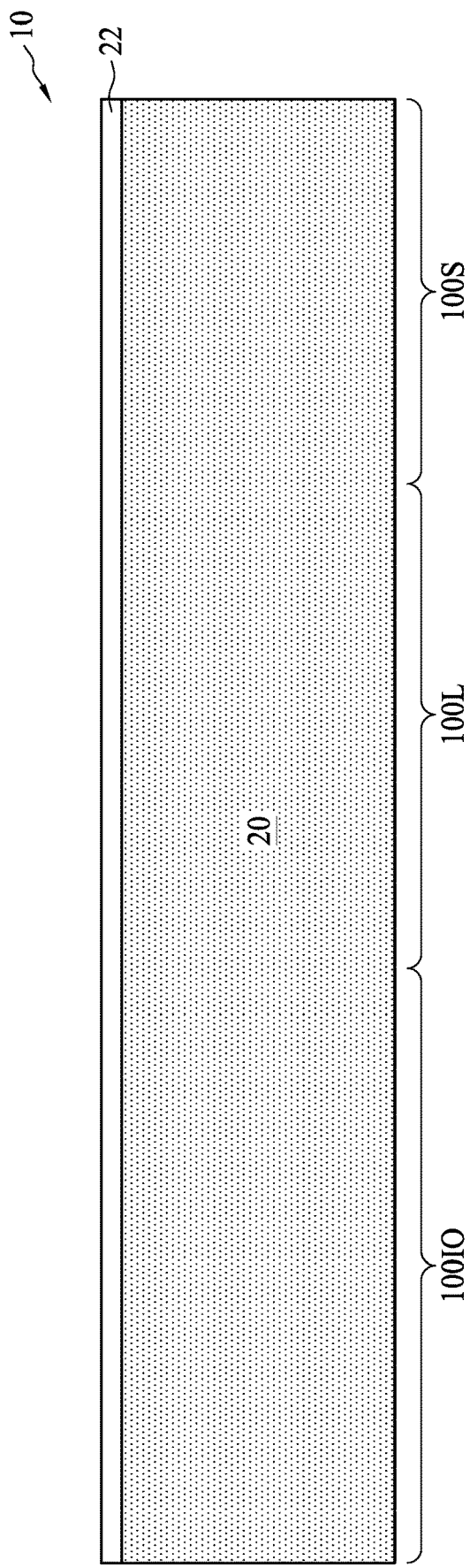
FIGS. 1 through 17 illustrate the cross-sectional views of intermediate stages in the formation of epitaxy regions and Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fully Strained Channels (FSCs) and the methods of forming the same are provided. In accordance with some embodiments, the FSCs include P-type Fully Strained Channels (PFSCs). The concept of the present disclosure may also be applied to the formation of N-type Fully Strained Channels (NFSCs). In accordance with some embodiments of the present disclosure, a semiconductor substrate is etched to form trenches, and epitaxy regions are epitaxially grown in the trenches. The top surfaces of the epitaxy regions in different regions such as Input/output (IO) device regions, logic device regions, Static Random Access Memory (SRAM) device regions, may be intentionally formed to be at different levels. This may compensate for the differences in the polishing rates in different device regions, and improve the co-planarity of the epitaxy regions in different device regions. Also, the profiles (for example, top corner rounding and bottom corner rounding) of the epitaxy regions are controlled to reduce the undesirable encroaching of silicon or silicon germanium into the fins that they don't belong to. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 17 illustrate the cross-sectional views of intermediate stages in the formation of epitaxy regions and Fin Field-Effect Transistors (FinFETs) in accordance with some embodiments of the present disclosure. The corresponding processes are also reflected schematically in the process flow shown in FIG. 18.

FIG. 1 illustrates a perspective view of an initial structure. The initial structure includes wafer 10, which further includes substrate 20. Substrate 20 may be a semiconductor substrate, which may be formed of or comprise a silicon substrate, a silicon germanium substrate, or a substrate formed of other semiconductor materials including and not limited to a III-V compound semiconductor such as GaAsP, AlInAs, AlGaAs, GaInAs, GaInP, GaInAsP, or the like. The top surface of substrate 20 may have a (100) surface plane. Substrate 20 may be doped with a p-type or an n-type impurity.

In accordance with some embodiments, wafer 10 includes a plurality of device regions. For example, FIG. 1 illustrates a first device region, a second device region, and a third device region. The plurality of device regions may be used for forming different functional circuits including, and not limited to, Input/output (IO) circuits, logic circuits (also referred to as core circuits), memory circuits or the like. The different functional circuits may have different requirements and different specifications, and hence the resulting devices such as transistors in these functional circuits will be different from each other. For example, the density and the size of the devices in different functional circuits may be different from each other. In accordance with some embodiments, an IO device region, a logic device region, and a Static Random Access Memory (SRAM) region are used as examples for explaining the concept of the present disclosure. Accordingly, wafer 10 may include IO region 100IO, logic region 100L, and SRAM region 100S in accordance with some embodiments. It is appreciated that the formation of epitaxy regions for other types of devices are also within the scope of the present disclosure. In accordance with some embodiments, it is assumed that a first epitaxy region (52A in FIG. 10) formed in IO device region 100IO is larger and wider than a second epitaxy region (52B in FIG. 10) formed in IO device region 100IO, which is further larger and wider than a third epitaxy region (52C in FIG. 10) in IO device region 100IO.

Further referring to FIG. 1, protection layer 22 is formed. The respective process is illustrated as process 202 in the process flow shown in FIG. 18. In accordance with some embodiments, protection layer 22 can protect the top surface of substrate 20 from contamination, prevent excessive damage to substrate 20 during the subsequent ion implantation processes, and can control the depth of dopants during subsequent ion implantation processes. Protection layer 22 may be formed of or comprise silicon oxide, for example, while other materials such as silicon carbide, silicon oxy-carbide, or the like, may also be used. In accordance with some embodiments, protection layer 22 has a thickness in a range between about 30 Å and about 150 Å, which may further be in the range between about 30 Å and about 90 Å.

Figure 2:
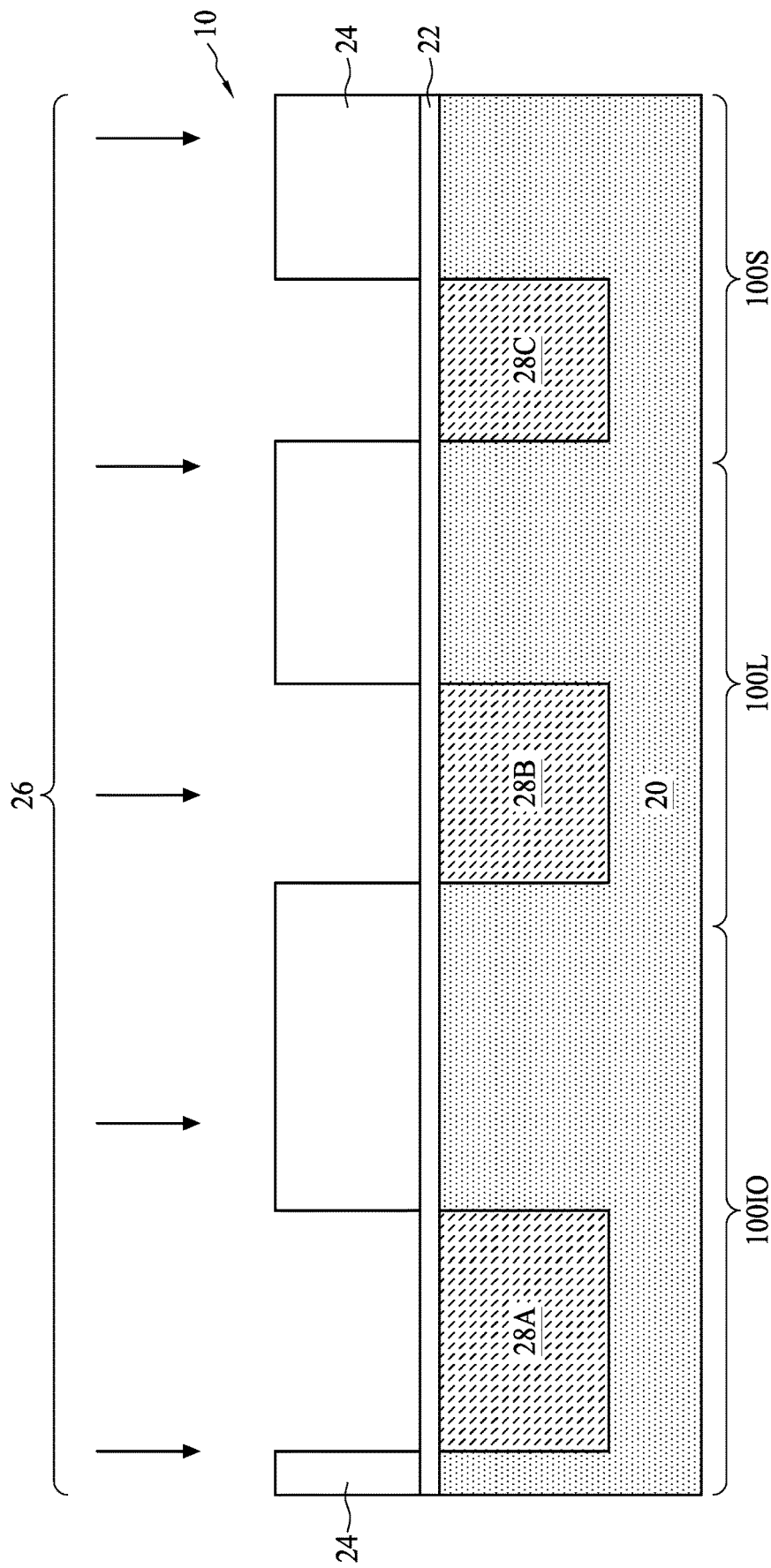

Referring to FIG. 2, an implantation mask 24, which may include a photo resist, for example, is formed and then patterned, exposing some portions of the underlying structure. Next, a first implantation process 26 is performed to implant an n-type dopant into substrate 20. The n-type dopant may include phosphorous (P), arsenic (As), antimony (Sb), or combinations thereof. As a result, n-well regions 28A, 28B, and 28C are formed in substrate 20 and in device regions 100IO, 100L, and 100S, respectively. The respective process is illustrated as process 204 in the process flow shown in FIG. 18. In accordance with some embodiments, the n-type dopant concentration in n-well regions 28A, 28B, and 28C may be in the range between about $5 \times 10^{16}/cm^3$ and about $1 \times 10^{19}/cm^3$. The depths of n-well regions 28A, 28B, and 28C may be in the range between about 100 nm and about 500 nm. The widths of n-well regions 28A, 28B, and 28C are selected according to the number and the size of devices that to be formed over them and the performance requirement. In accordance with some embodiments, the width of n-well region 28A is greater than the width of n-well region 28B, which is further greater than the width of n-well region 28C. After the formation of n-well regions 28A, 28B, and 28C, implantation mask 24 is removed.

Figure 3:
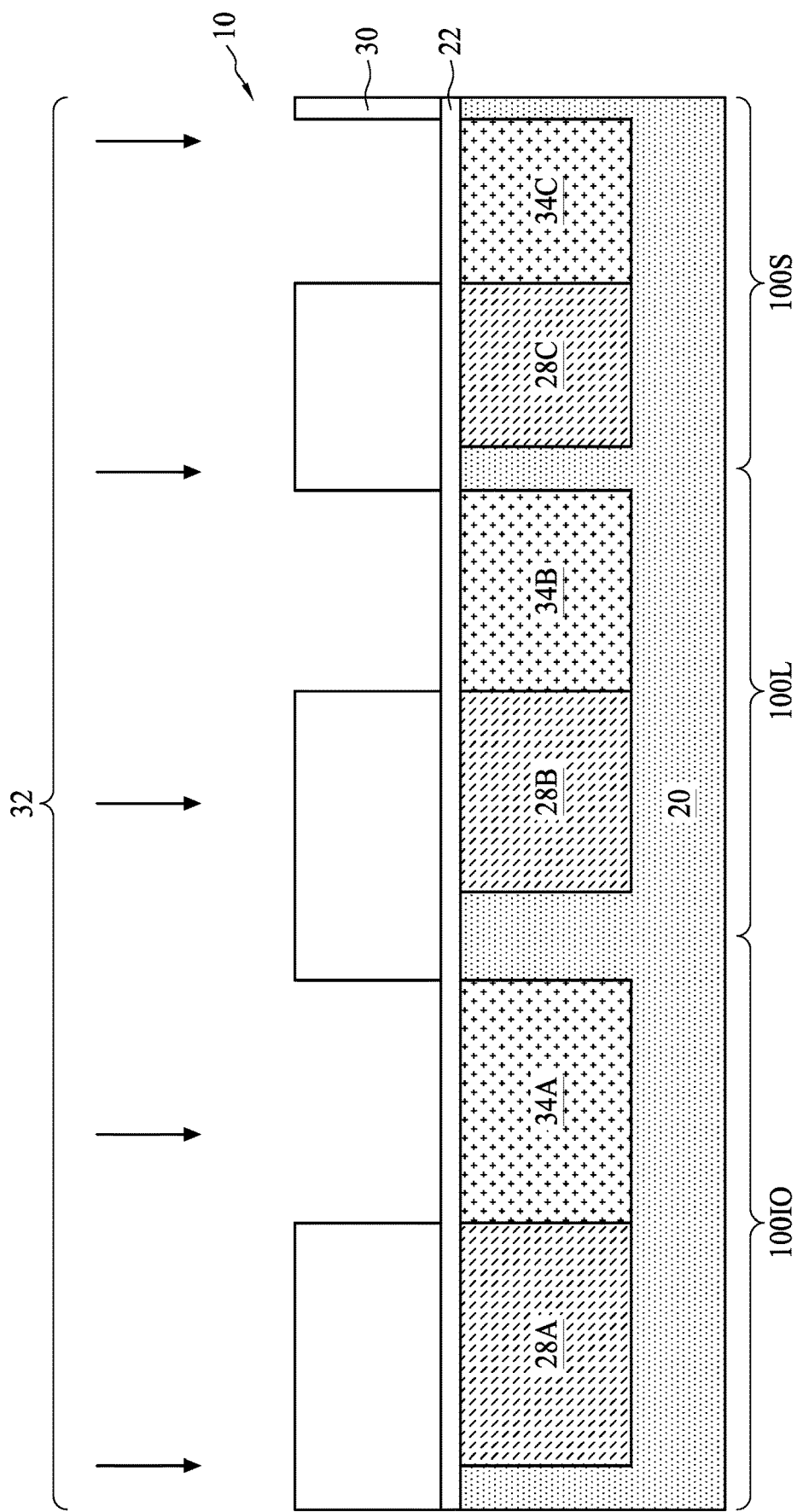

FIG. 3 illustrates the formation of p-type well regions 34A, 34B, and 34C in accordance with some embodiments. The respective process is illustrated as process 206 in the process flow shown in FIG. 18. It is appreciated that the order for forming n-type well regions and p-type well regions may be inversed. An implantation mask 30, which may include a photo resist, is formed and then patterned, exposing some portions of the underlying structure. Next, a second implantation process 32 is performed to implant a p-type dopant into substrate 20. The p-type dopant may include boron (B), indium (In), or their combination. As a result, p-well regions 34A, 34B, and 34C are formed in substrate 20 and in device regions 100IO, 100L, and 100S, respectively. P-well regions 34A, 34B, and 34C may have edges joining the edges of n-well regions 28A, 28B, and 28C, respectively. In accordance with some embodiments, the p-type dopant concentration in p-well regions 34A, 34B, and 34C may be in the range between about $5 \times 10^{16}/cm^3$ and about $1 \times 10^{19}/cm^3$. The depths of p-well regions 34A, 34B, and 34C may be in the similar range as n-well regions 28A, 28B, and 28C. The widths of p-well regions 34A, 34B, and 34C are also selected according to the number and the size of devices that to be formed therein and the performance requirement. In accordance with some embodiments, the width of p-well region 34A is greater than the width of p-well region 34B, which is further greater than the width of p-well region 34C. After the formation of p-well regions 34A, 34B, and 34C, implantation mask 30 is removed.

Figure 4:
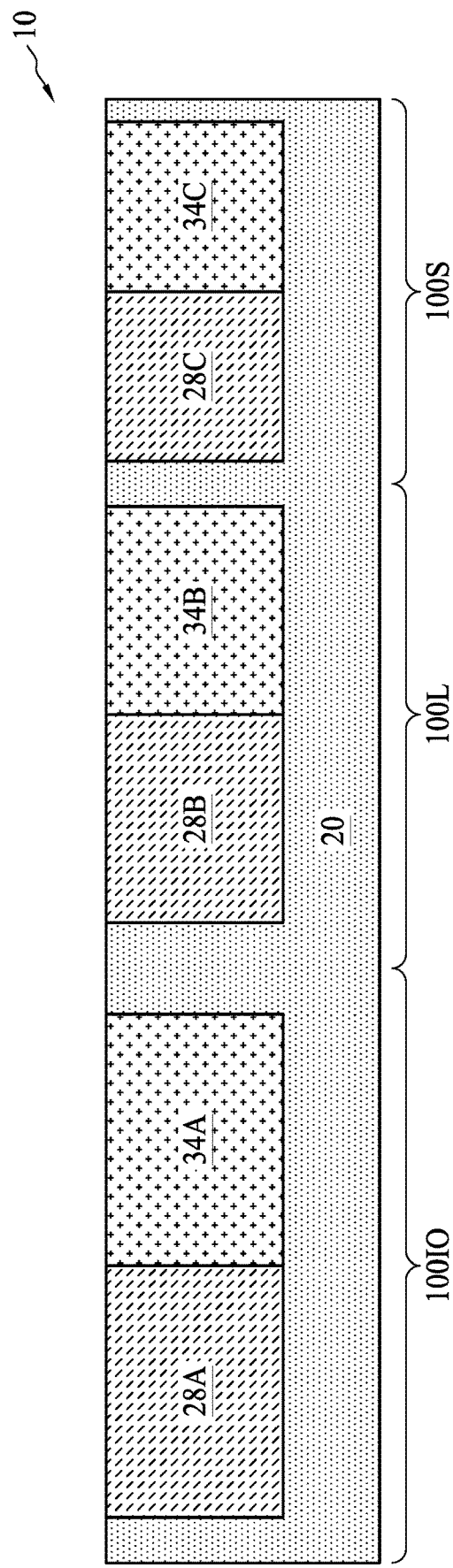

In accordance with some embodiments, an annealing process is performed to activate the dopants implanted during the preceding implantation processes, and repair any silicon crystal damage which occurred during the ion implantation processes. In accordance with some embodiments, the annealing process is performed at a temperature in a range between about 500° C. and about 950° C. The annealing process may be performed in an annealing furnace or in a Rapid Thermal Anneal (RTA) chamber. After the annealing process, protection layer 22 is removed, and the resulting structure is shown in FIG. 4.

Figure 5:
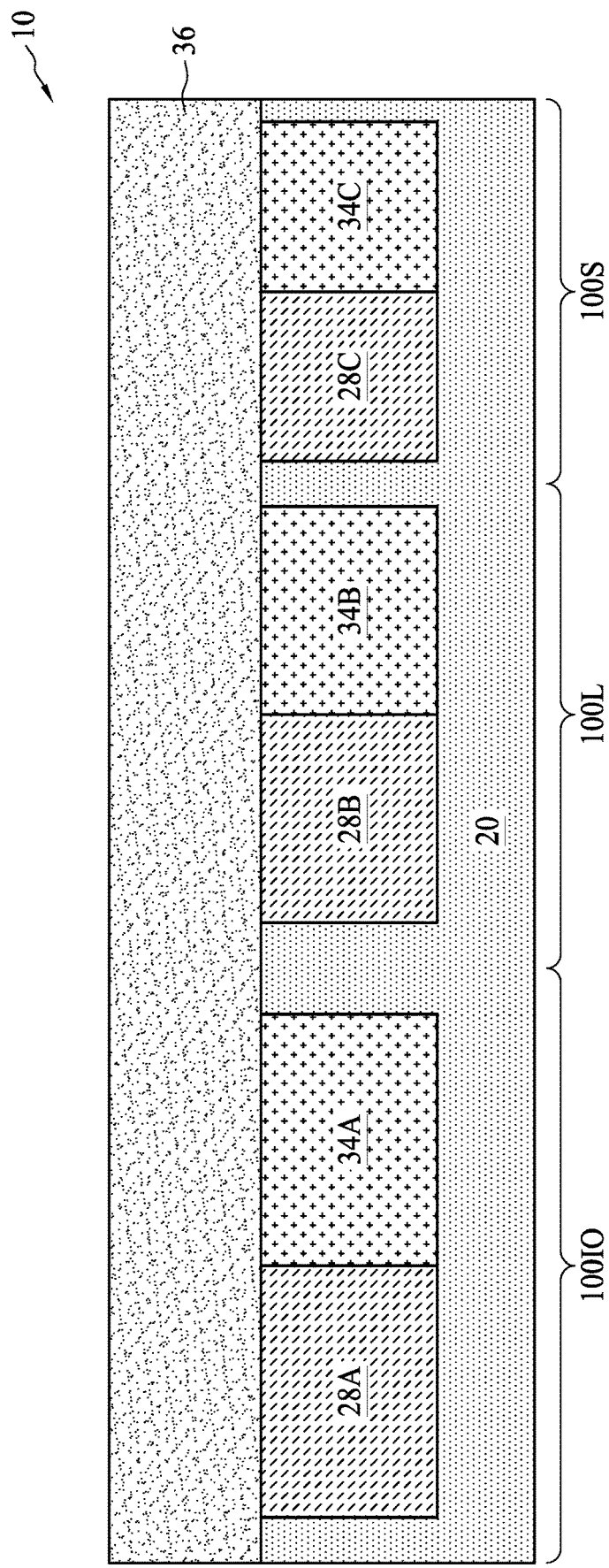

FIG. 5 illustrates an epitaxy process to deposit epitaxy layer 36. The respective process is illustrated as process 208 in the process flow shown in FIG. 18. In accordance with some embodiments, epitaxy layer 36 comprises silicon, which may be free from germanium. Epitaxy layer 36 may have a thickness in a range between about 300 Å and about 1,000 Å. The deposition may be performed through Chemical Vapor Deposition (CVD), Remote Plasma Chemical Vapor Deposition (RPCVD), Plasma Enhanced Chemical Vapor Deposition (PECVD), or the like. The process gas may include silane ($SiH_4$), silicon tetrachloride ($SiCl_4$), trichlorosilane (TCS), dichlorosilane ($SiH_2Cl_2$ or DSC), or the like. Hydrogen ($H_2$) may be used as a reactant gas that reduces the aforementioned process gases. The deposition temperature may be in the range between about 600° C. and about 1,250° C., depending on the gases used. For example, source gases with fewer chlorine atoms (e.g., DSC) may be used with lower formation temperatures compared to source gases with more chlorine atoms, such as $SiCl_4$ or TCS.

Figure 6:
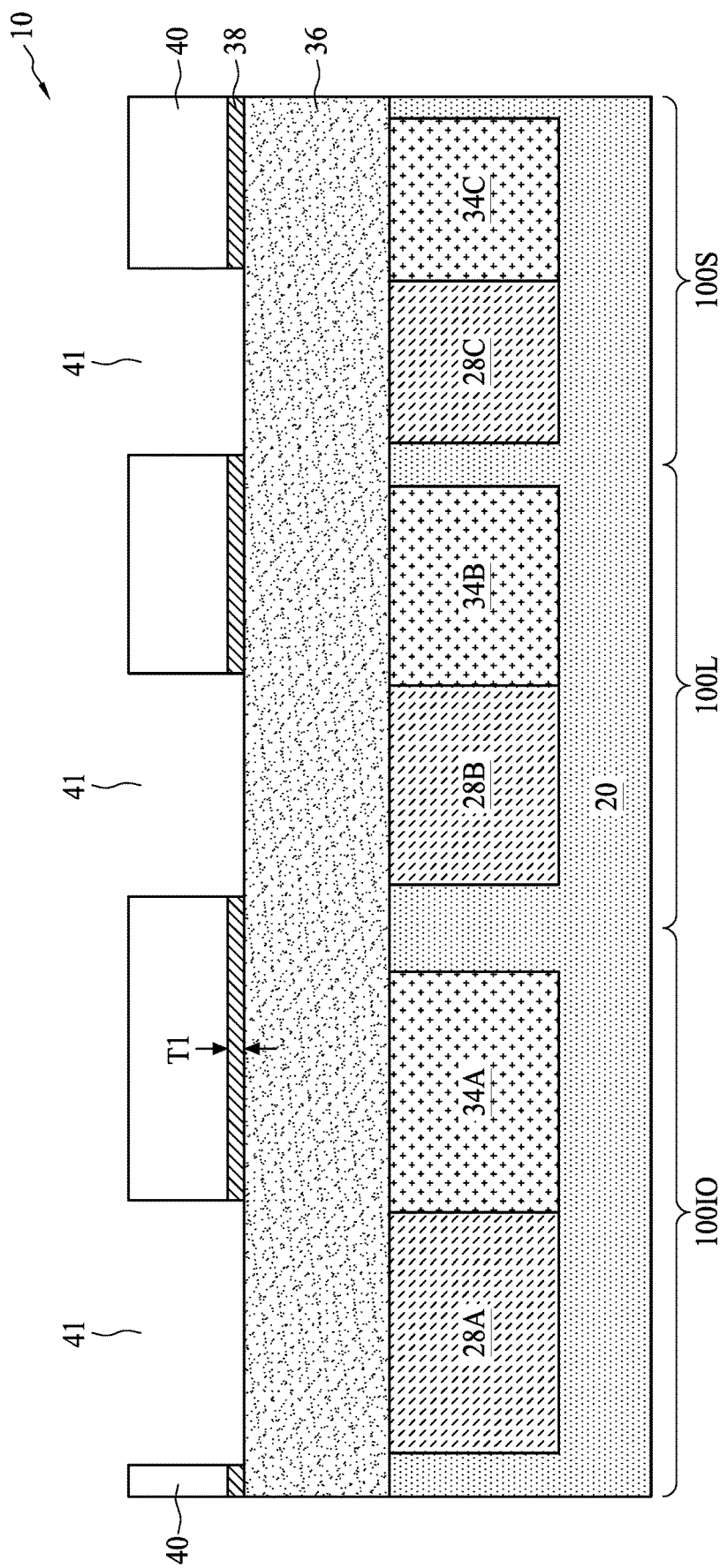

Referring to FIG. 6, epitaxy mask 38 is formed on epitaxy layer 36. A patterned etching mask 40 is formed on epitaxy mask 38, and is used to etch and pattern epitaxy mask 38, so that trenches 41 are formed in epitaxy mask 38. The respective process is illustrated as process 210 in the process flow shown in FIG. 18. The thickness T1 of epitaxy mask 38 cannot be too smaller, for example, smaller than 100 Å. Otherwise, the subsequent pre-clean process will not be sufficient to remove surface contaminations and may lead to defect formation. On the other hand, the mask thickness T1 cannot be too high. When the thickness is higher than 300 Å, defeats may be induced during polishing and hence causing defects. Accordingly, the thickness T1 may be in the range between about 100 Å and about 500 Å. In accordance with some embodiments, epitaxy mask 38 is formed of $SiO_2$. In accordance with alternative embodiments, epitaxy mask 38 is formed of a nitride, such as $Si_3N_4$.

Figure 7:
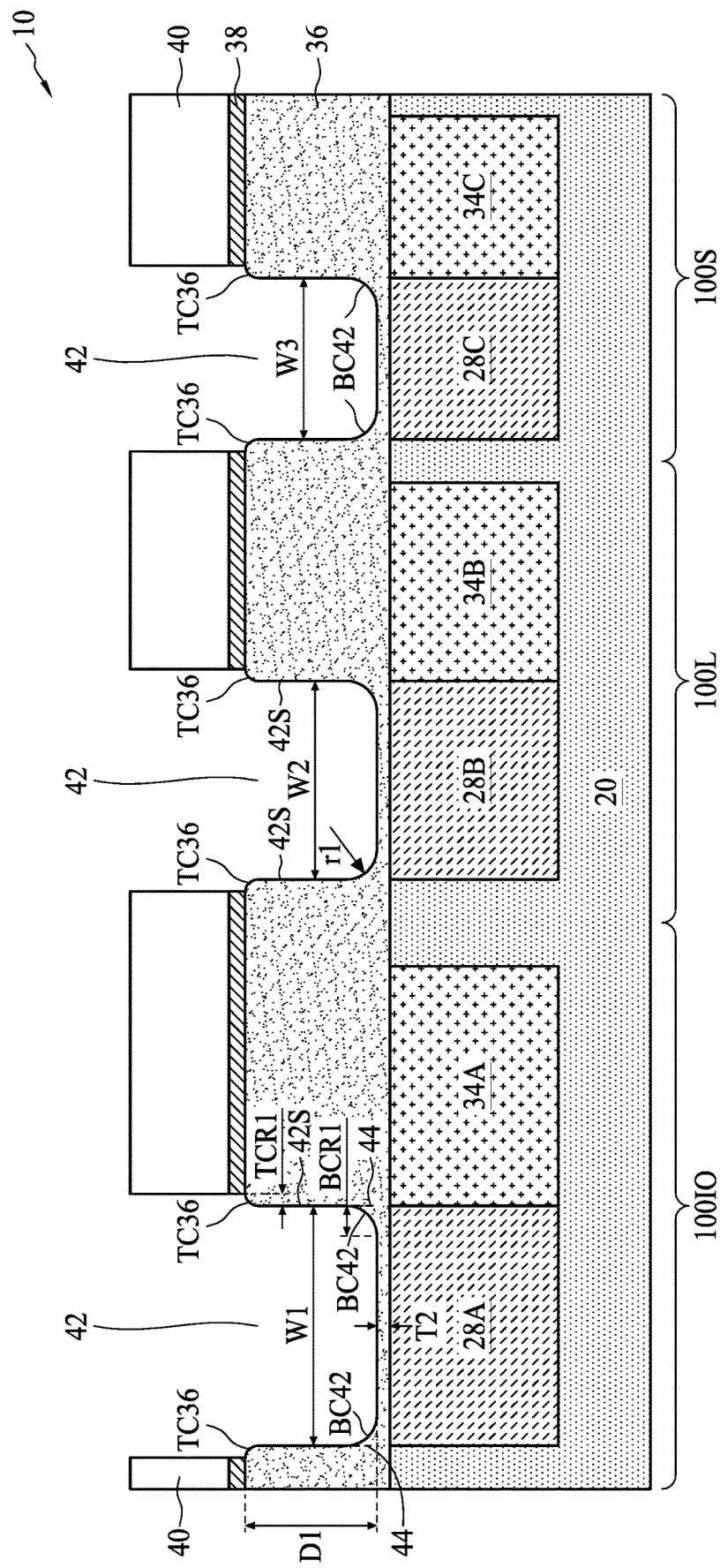

Referring to FIG. 7, epitaxy layer 36 is etched to form trenches 42 therein. The respective process is illustrated as process 212 in the process flow shown in FIG. 18. The etching process includes an anisotropic etching process, which is a dry etching process. In accordance with some embodiments, trenches 42 are aligned to n-well regions 28A, 28B, and 28C. In accordance with some embodiments, one or both of the lateral dimensions (lengths and widths) of trenches 42 are equal to the respective lateral dimensions of the respective underlying n-well regions 28A, 28B, and 28C. For example, trenches 42 may have equal widths as, but different lengths from, the respective underlying n-well regions 28A, 28B, and 28C. Alternatively, trenches 42 may have equal lengths as, but different widths from, the respective underlying n-well regions 28A, 28B, and 28C.

In accordance with some embodiments, the etching of epitaxy layer 36 is performed using etching mask 40 for defining patterns. Etching mask 40 may be removed after the etching of epitaxy layer 36 is finished, or after the etching of epitaxy layer 36 is partially finished. In accordance with alternative embodiments, the etching of epitaxy layer 36 is performed after the removal of etching mask 40, so that the patterned epitaxy mask 38 is also used as the etching mask to etch epitaxy layer 36.

In accordance with some embodiments, the etching process that forms trenches 42 in epitaxy layer 36 is timed so that a thin bottom portion of epitaxial layer 36 remains. The thickness T2 of the remaining portions of epitaxy layer 36 on top of n-well regions 28A, 28B, and 28C may be in the range between about 50 Å and about 100 Å.

In accordance with some embodiments, trenches 42 in device regions 100IO, 100L, and 100S have widths W1, W2, and W3, respectively. Widths W1, W2, and W3 may be in the range between about 1,000 Å to about 5,000 Å, and may be equal to or substantially equal to (for example, with a difference smaller than about 10 percent), of the widths of the respective underlying n-well regions 28A, 28B, and 28C. The depth D1 of trenches 42 is equal to the difference between the thickness of epitaxy layer 36 and the thickness of the remaining portion of epitaxy layer 36 on top of n-well regions 28A, 28B, and 28C. For example, depth D1 may be in the range between about 250 Å and about 1,000 Å in accordance with some embodiments.

In accordance with some embodiments, after the formation of trenches 42 in epitaxy layer 36, the edges of epitaxy mask 38 at the top corners of trenches 42 may become rounded. The rounding of epitaxy mask 38 at the corners of trenches 42 is attributed to the etching process of epitaxy mask 38 and the etching process for forming trenches 42. Epitaxy mask 38 may become thinner by the end of the removal of etching mask 40.

Trenches 42 have top corner rounding and bottom corner rounding. The top corner rounding is the rounding of the top corners TC36 of the un-etched portions of epitaxy layer 36. The bottom corner rounding is the rounding of the bottom corners BC42 of trenches 42. In accordance with some embodiments, tangent lines may be drawn on sidewalls 42S of trench 42. Since a sidewall includes rounded portions, the tangent lines drawn at different points of a sidewall 42S have different tilt angles. For at least one point of the sidewall, the corresponding tangent line is vertical. The vertical tangent line is likely, and not necessarily, drawn at a point close to the middle between the top and the bottom of the corresponding trench 42. Two example vertical tangent lines are drawn as lines 44. The lateral distance between vertical lines 44 and the point the sidewall of trench 42 joins the planar top surface of epitaxy layer 36 is referred to as top corner rounding TCR1 hereinafter. Similarly, the lateral distance between vertical line 44 and the point where the sidewall of trench 42 joins the planar bottom surface of trench 42 is referred to as bottom corner rounding BCR1 hereinafter. In accordance with some embodiments, the bottom of trench 42 may be a continuously rounded surface (with no planar portion) that is connected to opposing sidewalls of trench 42. Accordingly, the bottom corner rounding BCR1 may alternatively be defined as the radius r1 of a circle that best fits the bottom corners of trench 42, although the bottom corner may not be exactly a circle.

In accordance with some embodiments, after the etching of epitaxy layer 36 for forming trenches 42, and before other processes are performed on wafer 10, top corner rounding TCR1 may be smaller than about 2 nm, and bottom corner rounding BCR1 may be smaller than about 15 nm, and may be in the range between about 5 nm and about 15 nm.

Figure 8:
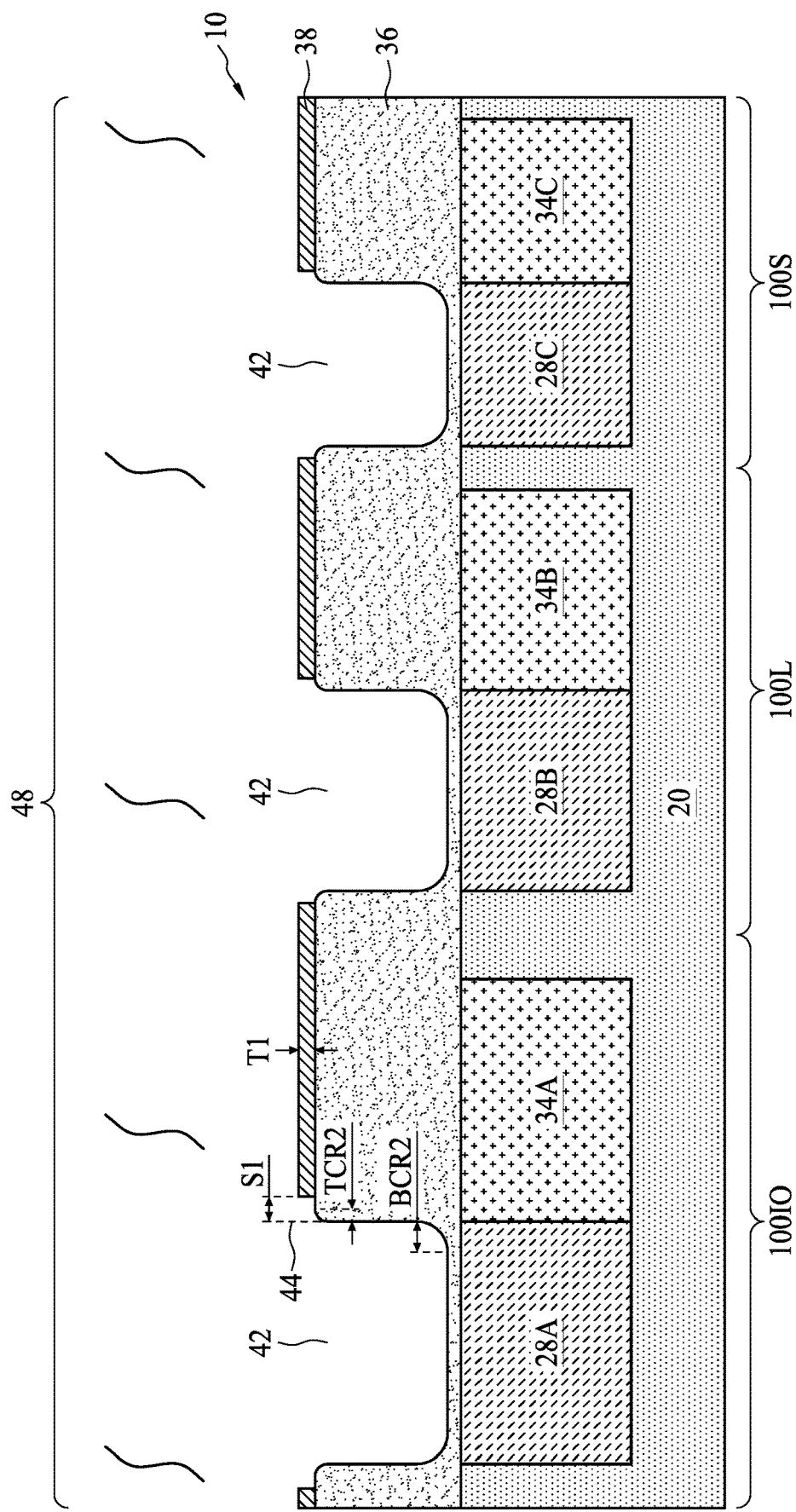

Referring to FIG. 8, a pre-clean process 48 is performed. The respective process is illustrated as process 214 in the process flow shown in FIG. 18. The pre-clean process 48 prepares the surfaces of trenches 42 for the subsequent epitaxial growth. In accordance with some embodiments, the pre-clean process 48 is performed with a process gas including a mixture of nitrogen trifluoride ($NF_3$), ammonia ($NH_3$), and an inert/carrier gas such as argon (Ar), helium (He), hydrogen ($H_2$), nitrogen ($N_2$), or the like, and/or combinations thereof. In accordance with some embodiments, hydrochloric acid (HCl) vapor is also included. In accordance with alternative embodiments, the pre-clean process 48 is performed with a process gas including hydrogen fluoride (HF) and ($H_2$), and may include an inert/carrier gas such as argon (Ar), helium (He), hydrogen ($H_2$), nitrogen ($N_2$), or the like. In accordance with some embodiments, the power provided for generating the plasma may include a Radio Frequency (RF) power and/or a Direct Current (DC) power. The pre-clean process 48 may be performed at room temperature or an elevated temperature, for example, between about 25° C. and about 300° C. The ambient pressure may be in the range between about 0.5 Torr to about 3 Torr. In accordance with some embodiments, the pre-clean process 48 removes the native silicon oxide ($SiO_x$) and/or contaminants, such as carbon, fluorine, chlorine, and phosphorous from the exposed surfaces of epitaxy layer 36.

Since the process gas targets silicon oxide, a top portion of epitaxy mask 38 may be (or may not be, depending on material) etched during the pre-clean process 48, and hence is thinned. Consequently, the thickness of epitaxy mask 38 is reduced. Additionally, epitaxy mask 38 is laterally recessed by distance S1. As described carrier, the rounding of epitaxy mask 38 occurred during the formation of trenches 42. In accordance with some embodiments, thickness T1 of epitaxy mask 38 may be greater or equal to recessing distance S1. For example, ratio T1/S1 may be in the range between about 1.0 and about 1.5. In accordance with some embodiments, the thickness of epitaxy mask 38 may be reduced by about 20 Å to about 250 Å depending on the process conditions and the duration of pre-clean process 48. The pre-clean process 48 may be also stopped when the thickness of epitaxy mask 38 has been reduced by between about 40 percent and about 70 percent.

In accordance with some embodiments, the thickness of epitaxy mask 38 can be modulated to mitigate loading effects, so that the intended loading (the difference between LH1. LH2, and LH3 (FIG. 10)) are generated between the epitaxy regions in device regions 100IO, 100L, and 100S. For example, when the thickness T1 is reduced, the loading between the epitaxy regions 52A, 52B, and 52C (FIG. 10) in device regions 100IO, 100L, and 100S is reduced. Conversely, when the thickness T1 is increased, the loading between the epitaxy regions 52A, 52B, and 52C is accordingly increased. Accordingly, the thickness T1 is adjusted to achieve the desirable loading. For example, the original thickness T1 of epitaxy mask 38 (as deposited) and the etching chemical in the pre-clean process 48, etc., may be adjusted to achieve a desirable thickness T1 (at the time the subsequent epitaxy is started). In accordance with some embodiments, an additional etching process may be performed after the pre-clean process (and before the subsequent epitaxy process) to further thin epitaxy mask 38 to the desirable value. The additional etching may be performed using an anisotropic etching process. In the additional etching process, epitaxy layer 36 may not be etched.

In accordance with some embodiments, after the pre-clean process 48 is performed, epitaxy layer 36 and trenches 42 have top corner rounding TCR2, which is increased over the top corner rounding TCR1 as shown in FIG. 7. Top corner rounding TCR2 may be in the range between about 2 nm and about 10 nm, and bottom corner rounding BCR2 may be smaller than about 10 nm, and may be in the range between about 5 nm and about 10 nm. In the pre-clean process 48, process conditions are adjusted, so that the bottom corner rounding BCR2 may be reduced, or at least not increased, compared to the bottom corner rounding BCR1 before the pre-clean process 48.

Figure 9:
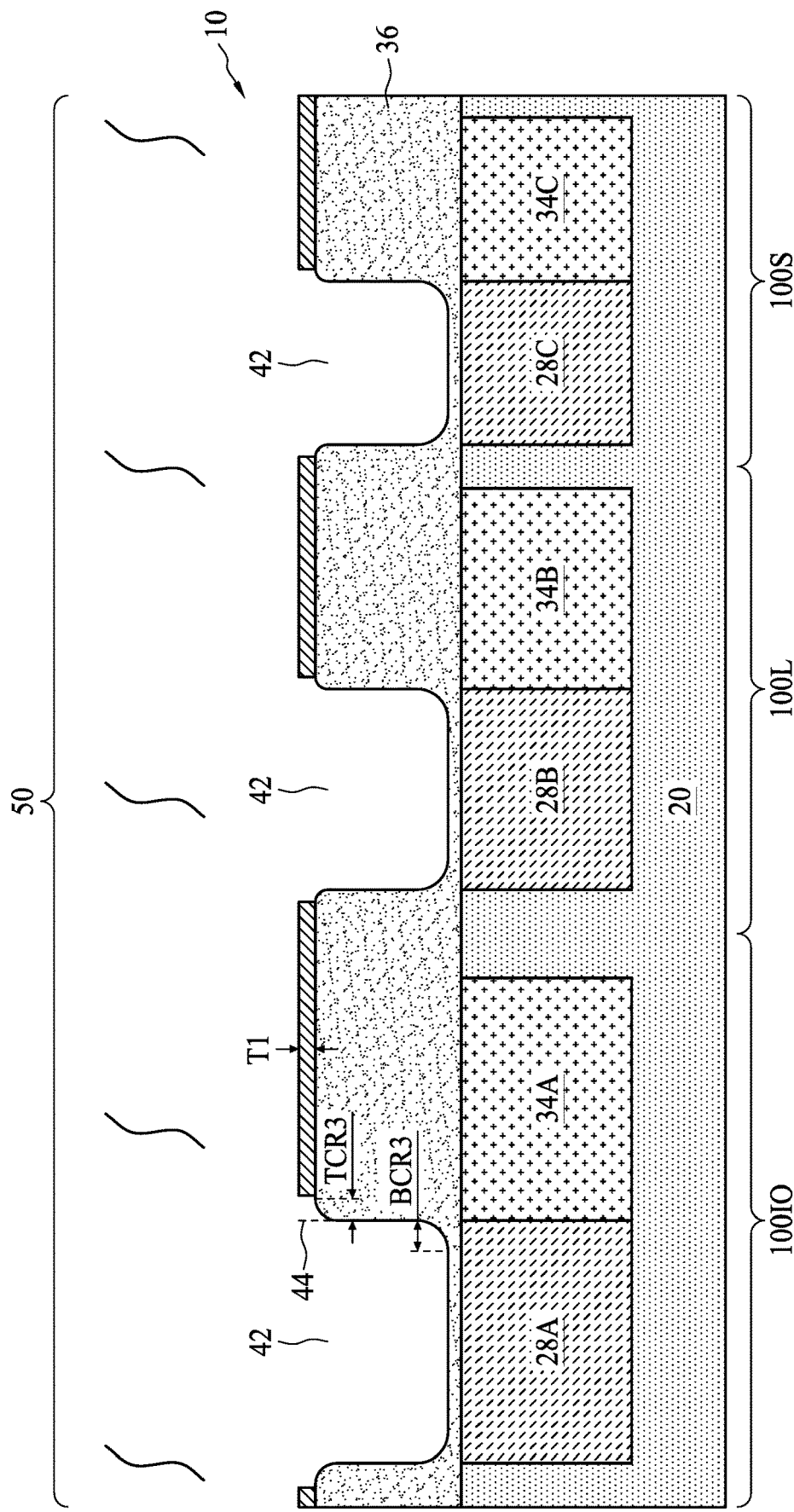

Next, as shown in FIG. 9, baking process 50 is performed, for example, in the same process chamber in which epitaxy process (FIG. 10) is performed. The respective process is illustrated as process 216 in the process flow shown in FIG. 18. In accordance with some embodiments, baking process 50 is performed at a temperature Temp1 that is higher than the subsequent seed and epitaxial layer formation temperatures. For example, the baking temperature Temp1 may be about 20% to about 30% higher than the seed and epitaxial layer formation temperatures. In accordance with some embodiments, the baking temperature may be in the range between about 750° C. and about 950° C. In accordance with some embodiments, the baking ambient may include hydrogen ($H_2$) and an inert gas such as Ar, $N_2$, He, or combinations thereof. In addition, the ambient pressure may be in the range between about 100 Torr and about 600 Torr. The baking process may last between about 30 seconds and about 180 seconds. In accordance with some embodiments, bake process 50 may reduce the surface roughness of trenches 42, and may reduce width changes or sidewall tapering of trenches 42.

In accordance with some embodiments, after the baking process 50 is performed, epitaxy layer 36 and trenches 42 have top corner rounding TCR3, which may be increased over the top corner rounding TCR2 as shown in FIG. 8. For example, top corner rounding TCR3 may be in the range between about 5 nm and about 15 nm. The bottom corner rounding BCR3 of trenches 42 may also be increased over the bottom corner rounding BCR2 as shown in FIG. 8. For example, bottom corner rounding BCR3 may be in the range between about 10 nm and about 25 nm. As both of top corner rounding TCR3 and bottom corner rounding BCR3 may be increased due to the baking process 50, the process conditions of baking process 50 are adjusted so that there is a balance between top corner rounding TCR3 and bottom corner rounding BCR3, and neither of them becomes excessively high.

It is desirable that both of top corner rounding and the bottom corner rounding are as small as possible. Accordingly, the preceding processes shown in FIGS. 7 through 9 are controlled to reduce both of the top corner rounding and the bottom corner rounding, and to form vertical sidewalls and planar bottom surfaces for trenches 42. It is appreciated, however, that it is difficult to reduce both of top corner rounding and the bottom corner rounding at the same time. In which case, it is preferred to reduce the top corner round TCR3 as a higher priority than reducing the bottom corner rounding BCR3, providing the bottom corner round BCR3 is not excessive. The reason is that the top corner rounding TCR3 affects the size such as the width of the epitaxy region, making process control to be more difficult. In addition, the top corner rounding may cause overlay shift since the top portion of the resulting epitaxy regions are larger than the underlying bulk portions. In accordance with some embodiments, the top corner rounding TCR3 is controlled to be smaller than bottom corner rounding BCR3, and may be controlled to be smaller than about 0.5BCR3. It is appreciated that in some scenarios, bottom corner rounding BCR3 may be undesirably greater than top corner rounding TCR3, in which case, ratio TCR3/BCR3 is still controlled to be smaller than 2. The top corner rounding may be controlled, for example, by selecting proper process gases for the pre-clean process, so that the lateral recessing distance S1 of epitaxy mask 38 is reduced. Since epitaxy mask 38 may protect the top corners of epitaxy layer 36 from being attacked, reducing lateral recessing distance S1 may help reducing top corner rounding. In the situation in which the thickness of is adjusted by etching, the etching may be performed through an anisotropic etching process to reduce lateral recessing of epitaxy mask 38.

Figure 10:
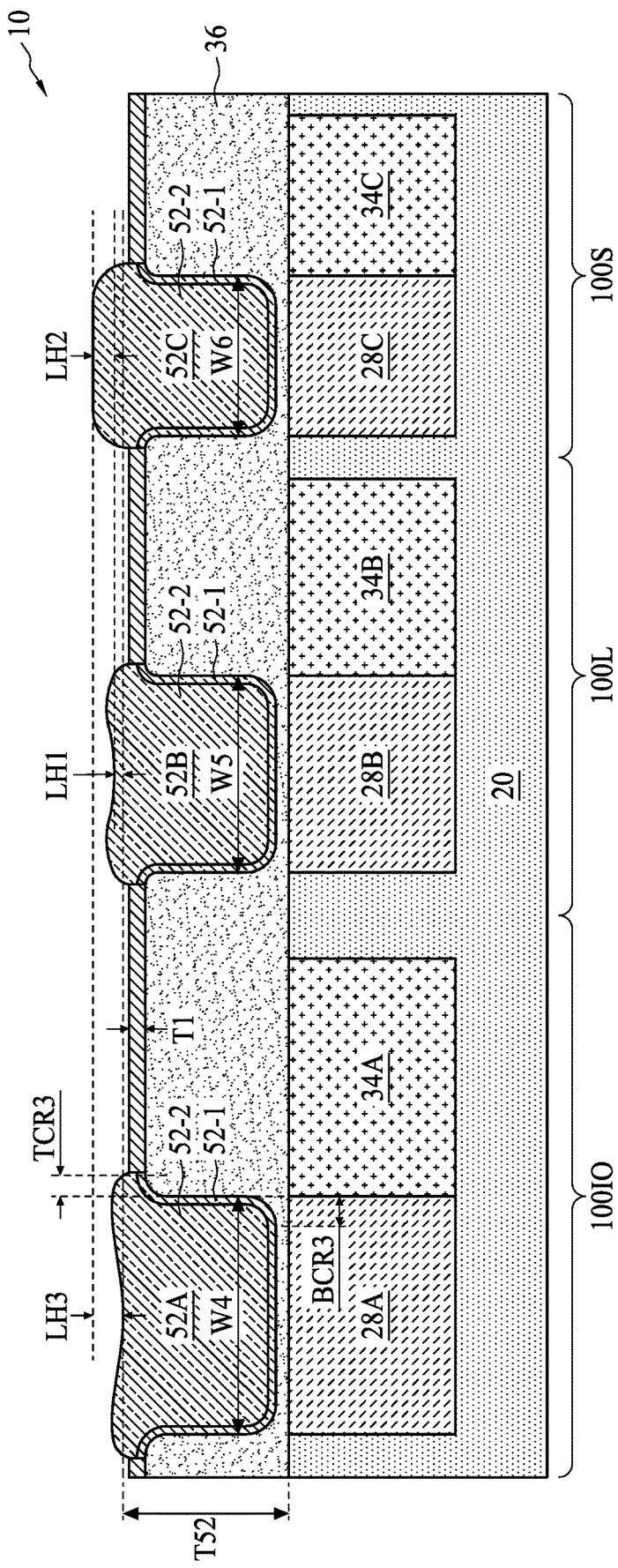

FIG. 10 illustrates the epitaxy process(es) for forming epitaxy regions 52A, 52B, and 52C. The respective process is illustrated as process 218 in the process flow shown in FIG. 18. In accordance with some embodiments, the formation of epitaxy regions 52A, 52B, and 52C includes epitaxially growing seed layer 52-1, and SiGe layer 52-2 over seed layer 52-1. In accordance with alternative embodiments, the growth of the seed layer is skipped, and SiGe layer 52-2 is in physical contact with epitaxy layer 36. Both of the seed layer 52-1 and SiGe layer 52-2 are selectively grown on the exposed surfaces of epitaxy layer 36 that are not masked by epitaxy mask 38, such as the surfaces exposed to trenches 42, but not the exposed dielectric materials such as epitaxy mask 38. In accordance with some embodiments, seed layer 52-1 may be a Si layer, a silicon germanium layer, a carbon-doped silicon layer, or the like, or combination thereof. The Thickness of seed layer 52-1 may be in the range between about 30 Å and about 100 Å. Seed layer 52-1 may also be a composite layer including a plurality of sub-layers. For example, seed layer 52-1 may include a silicon sub-layer and a silicon germanium sub-layer or a carbon-doped silicon layer over the silicon layer. The SiGe sub-layer, if formed, may have a germanium atomic percentage lower than about 1 percent. The carbon-doped silicon sub-layer, if formed, may have a carbon atomic percentage smaller than about 2 percent. Since the seed layer 52-1 grows faster at corners, the top corner rounding may be reduced, for example by about 10 percent and about 30 percent. The bottom corner rounding, on the other hand, may stay the same, or may be reduced. The growth of seed layer 52-1 in trenches 42 may be non-uniform. For example, the sidewall thickness of seed layer 52-1 may be smaller than the thickness of the portions of seed layer 52-1 at the bottoms of trenches 42. This also helps to reduce BCR3 significantly (for example, by about 20 percent to 30 percent). The ratio of side thickness to bottom thickness is smaller than 1.0, and may be in the range between about 0.4 and about 0.95. The thickness of seed layer 52-1 may be selected so that the top corner rounding may be reduced to a satisfactory value, if it was not. Since seed layer 52-1 may be formed of silicon, SiGe layer 52-2 is thus formed as having smaller corner rounding values than in FIG. 9. In accordance with some embodiments, seed layer 52-1 is deposited by CVD, RPCVD, or the like. The process gas may include SiH$_4$ and/or DCS, and may further include H$_2$ or N$_2$. An etching gas such as hydrochloric acid (HCl) is further added into the process gas to achieve the selective growth. If germanium is to be included in the seed layer, a germanium-containing gas such as germane (GeH$_4$) may be added.

SiGe layer 52-2 is then grown through epitaxy to fully fill trenches 42. SiGe layer 52-2 is selectively grown on seed layer 52-1 (if formed) or on epitaxy layer 36, but not on the exposed dielectric materials such as epitaxy mask 38. The precursors may include a silicon-containing gas such as SiH$_4$, Si$_2$H$_6$, SiH$_2$Cl$_2$, or combinations thereof, a germanium-containing gas such as GeH$_4$, Ge$_2$H$_6$, or combinations thereof, and an etching gas such as HCl. Other gases such as H$_2$, N$_2$, Ar, or the like may also be added. The temperatures Temp2 for depositing the seed layer 52-1 and SiGe layer 52-2 may be in the range between about 600° C. and about 700° C. The pressure of the process gases may be in the range between about 10 Torr and about 50 Torr.

In accordance with some embodiments, the germanium atomic concentration in SiGe layer 52-2 is in the range between about 20 atomic percent and about 40 atomic percent. SiGe layer 52-2 may have a uniform germanium atomic percentage, or may have a gradient germanium atomic percentage, with the upper portions having higher germanium atomic percentages than the respective lower portions. In accordance with some embodiments, SiGe layer 52-2 may include a first sub-layer that has a germanium atomic percentage up to about 5 atomic percent, and a second sub-layer with a constant germanium atomic percentage throughout the thickness of the remaining SiGe layer 52-2, with the second sub-layer having a germanium atomic percentage in the range between about 20 atomic percent and about 40 atomic percent.

In accordance with some embodiments, epitaxy regions 52A, 52B, and 52C have lateral dimensions, which may be lengths or widths, and are expressed as lateral dimensions W4, W5, and W6, respectively, which may be measured at the level where tangent lines of the sidewalls of epitaxy regions 52A are vertical. In accordance with some embodiments, lateral dimension W4 is greater than lateral dimension W5, and lateral dimension W5 is further greater than lateral dimension W6. For example, the ratio W4/W5 may be in the range between about 1.5 and about 4, and ratio W5/W6 may be in the range between about 1.5 and about 4. Ratio W4/W6 may also be in the range between about 2 and about 8 in accordance with some embodiments. In the top view of the structure shown in FIG. 10, the areas of epitaxy regions 52A is greater than epitaxy regions 52B, which is also greater than the area of epitaxy regions 52C. In accordance with some embodiments, bottom corner rounding BCR3 is smaller than about 20 percent of a thickness T52 of the corresponding epitaxy regions 52A, 52B, and 52C, and top corner rounding TCR3 is smaller than about 10 percent of thickness T52 of the corresponding epitaxy regions 52A, 52B, and 52C.

Figure 11:
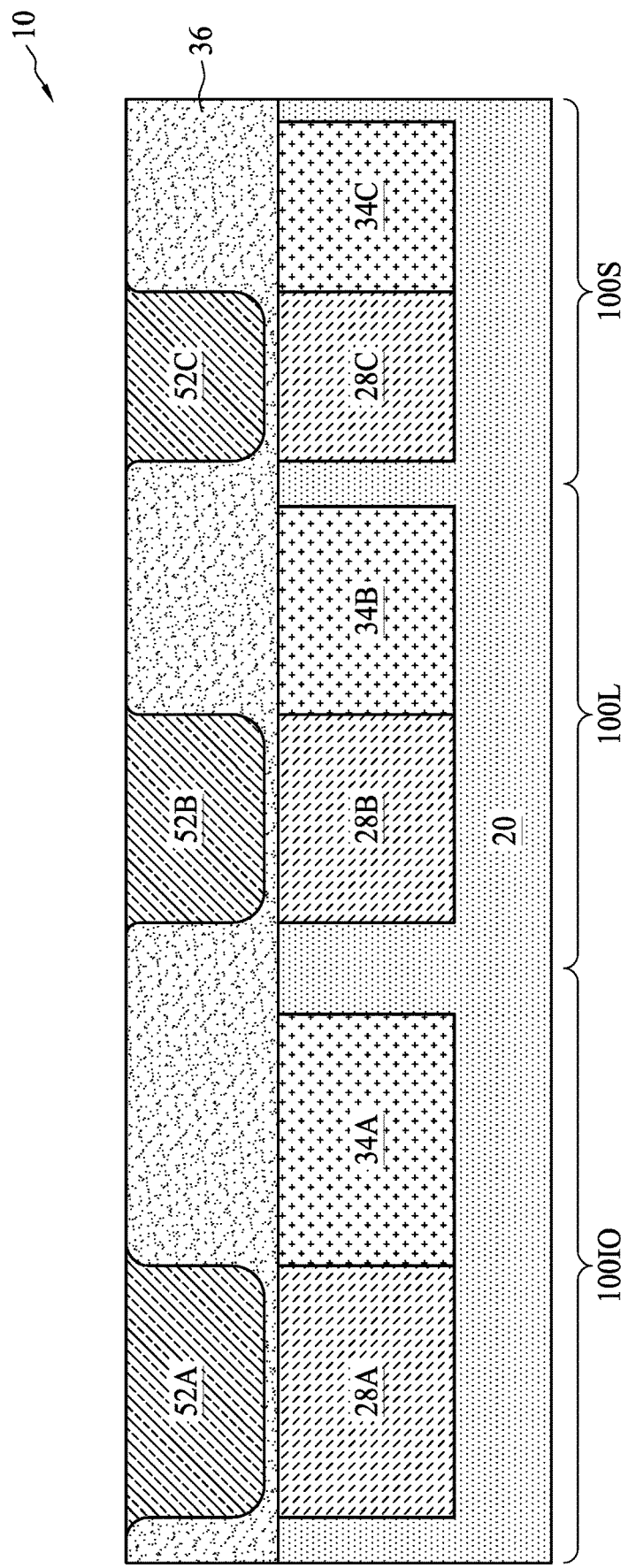

In accordance with some embodiments, the top surfaces of epitaxy regions 52A, 52B, and 52C are at different levels. It is appreciated that different portions (such as left, middle and right portions) of each of the epitaxy regions may have top surfaces at different levels, and the top surfaces in the middle between left sidewall and right sidewall of the respective epitaxy regions 52A, 52B, and 52C are used for the following discussion in accordance with some embodiments. The height difference between the top surfaces of epitaxy regions 52A, 52B, and 52C are referred to as the loading of the epitaxy regions hereinafter. In accordance with some embodiments, the top surface of epitaxy region 52B is higher than the top surface of epitaxy region 52A by loading (height difference) LH1, the top surface of epitaxy region 52C is higher than the top surface of epitaxy region 52B by loading LH2, and the top surface of epitaxy region 52C is higher than the top surface of epitaxy region 52A by loading LH3. The loadings LH1, LH2, and LH3 are controlled to be in selected ranges. Converse to conventional requirements, the loadings LH1, LH2, and LH3 are selected to be not too small (and also not too big), so that in subsequent CMP processes as shown in FIG. 11, the difference in the CMP rates between epitaxy regions 52A, 52B, and 52C are compensated for by loadings LH1, LH2, and LH3 without over-compensation. For example, if the loadings LH1, LH2, and LH3 are too big, the top surface of the resulting epitaxy region 52C will be significantly higher than the top surface of the resulting epitaxy region 52B, and the top surface of the resulting epitaxy region 52B will be significantly higher than the top surface of the resulting epitaxy region 52A. Conversely, if the loadings LH1, LH2, and LH3 are too small, the top surface of the resulting epitaxy region 52C will be significantly lower than the top surface of the resulting epitaxy region 52B, and the top surface of the resulting epitaxy region 52B will be significantly lower than the top surface of the resulting epitaxy region 52A. The top surfaces of epitaxy regions 52A, 52B, and 52C after the subsequent polishing process thus may be planar, and all of the epitaxy mask 38 may be removed, while the over-polishing of the underlying epitaxy layer 36 is minimized.

In accordance with some example embodiments, the loadings LH1 and LH2 are selected to be in the range between about 5 nm and about 30 nm, and the loading LH3 is selected to be in the range between about 10 nm and about 50 nm. Loadings LH1, LH2, and LH3 may be adjusted through the following adjustment approaches. For example, as aforementioned, the loadings are affected by the thickness T1 of epitaxy mask 38, and reducing the thickness T1 of epitaxy mask 38 reduces the loading, and vice versa. The loadings are also inversely proportional to the epitaxy temperature for forming epitaxy regions 52A, 52B, and 52C, with higher temperatures leading to lower loadings, and vice versa. For example, at a lower temperature in the range between about 650° C. and about 680° ° C., loading LH2 may be about 3 nm to about 4 nm. When the epitaxy temperature is increased to be in a range between about 690° C. and about 720° C., the loading may be reduced to between about 0.5 nm and about 2 nm. When the epitaxy temperature is too high, the loadings LH1, LH2, and LH3 may even have negative values, which mean the top surface of epitaxy region 52A is higher than the top surface of epitaxy region 52B, and/or the top surface of epitaxy region 52B is higher than the top surface of epitaxy region 52C. Furthermore, since the process gas for depositing epitaxy regions 52A, 52B, and 52C include both of deposition gas (such as GeH$_4$, SiH$_4$, and/or DCS) and an etching gas such as HCl, both deposition effect and etching effect occur at the same time, with the net effect being depositing. The ratio ER/DR (etching rate ER to deposition rate DR) also affects the loadings, and ratio ER/DR may be proportional to the loadings LH1, LH2, and LH3. In accordance with some embodiments, the ratio ER/DR is controlled to be in the range between about 0.05 and about 0.15 to achieve desirable loadings. Furthermore, the loadings may be affected by purging epitaxy chamber and performing chamber baking. For example, when purging the chamber using N$_2$ or H$_2$ for a period of time in the range between about 12 hours and about 30 hours, the loadings may be reduced, for example, by about 0.5 nm and about 1.0 nm, and longer time results in smaller loadings, and vice versa. When performing the chamber baking in $H_2$ for about 12 hours and about 40 hours, the loadings may be reduced, for example, by about 1 nm and about 2 nm, and longer baking time results in smaller loadings, and vice versa. By performing one or more of these adjustment methods in combination, the loadings LH1, LH2, and LH3 may be adjusted to desirable ranges.

In accordance with some embodiments, to determine optimum process parameters as discussed above such as the thickness of epitaxy mask 38, the epitaxy temperature, the ER/DR ratio, the purging duration, the baking duration, etc., a plurality of experiments may be performed to form a plurality of sample wafers, in which the processes shown in FIGS. 1 through 10 are performed. The process parameters of the different samples are adjusted to find out the effect the respective parameters. For example, a plurality of sample wafers may be made with the respective epitaxy mask 38 adopting different thicknesses, so that the effect of the thickness of epitaxy mask 38 may be determined, and the optimum thickness of epitaxy mask 38 for achieving the desirable loading are found. Similarly, sample wafers may be made to find the effect of other parameters as aforementioned. The optimum parameters and the optimum combinations of these parameters (two or more of the parameters in any combination) for achieving the desirable loading may be found through experiments.

In a subsequent process, a CMP process is performed to remove epitaxy mask 38 and the top portions of epitaxy region 52A, 52B, and 52C. The respective process is illustrated as process 220 in the process flow shown in FIG. 18. The resulting structure is shown in FIG. 11. The CMP process may include two steps. The first step is performed until epitaxy mask 38 is removed, and epitaxy layer 36 is exposed. A second step, which is an over-polishing step, is then performed to remove a pre-determined thickness of epitaxy layer 36 and epitaxy region 52A, 52B, and 52C. The over-etching is to ensure that all of epitaxy region 52A, 52B, and 52C are coplanar, and there is no recess in epitaxy region 52A, 52B, and 52C. It is desirable that in the first step, the remaining portions of epitaxy region 52A, 52B, and 52C have their top surfaces coplanar. It is appreciated that in the CMP process, epitaxy region 52C may have a higher CMP rate (polishing rate) than epitaxy region 52B, and epitaxy region 52B may have a higher CMP rate than epitaxy region 52A. The loadings LH1, LH2, and LH3 are designed to compensate for the difference in the polishing rates of epitaxy region 52A, 52B, and 52C, so that when the first CMP step is finished, the top surfaces of epitaxy region 52A, 52B, and 52C are substantially coplanar. The over-polishing thickness is small, and will not change the co-planarity of the top surfaces of epitaxy region 52A, 52B, and 52C.

Figure 12:
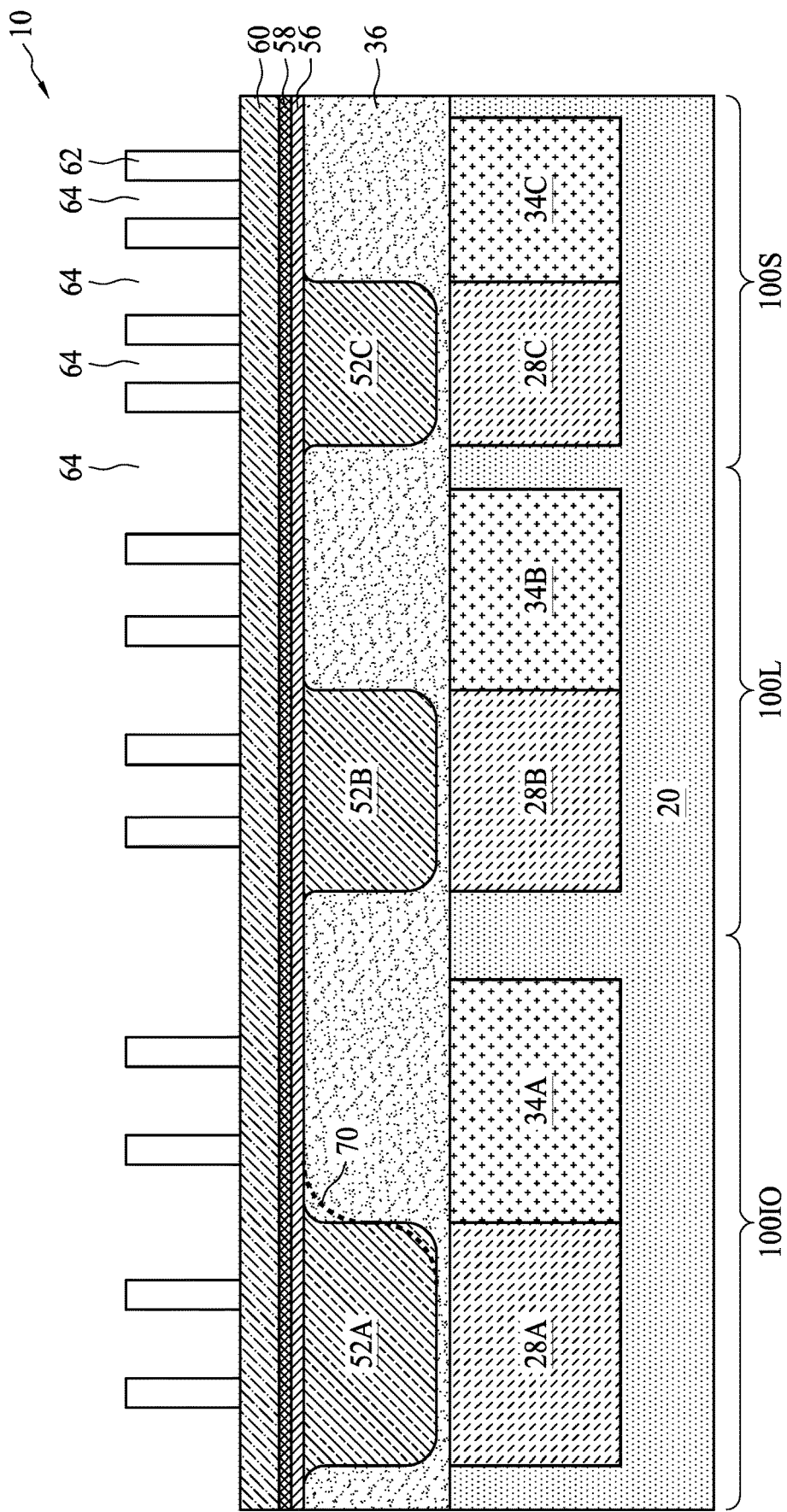

FIGS. 12 through 15 illustrate the formation of protruding fins. It is appreciated that the illustrated formation process of protruding fins may be more complicated than illustrated, and may include, for example, double patterning process, quadruple patterning etc. Referring to FIG. 12, a plurality of layers including layers 56, 58, and 60 and etching mask 62 are formed. The respective process is illustrated as process 222 in the process flow shown in FIG. 18. The layers may include silicon layer 56, which is deposited, for example, through epitaxy. The thickness of silicon layer 56 may be in the range between about 10 Å and about 100 Å. Subsequently, pad oxide layer 58 and hard mask 60 are deposited over the silicon layer 56. An etching mask 62, which may comprise a photo resist, is formed and patterned to define the size and spacing (pitch) of the protruding fins.

Figure 13:
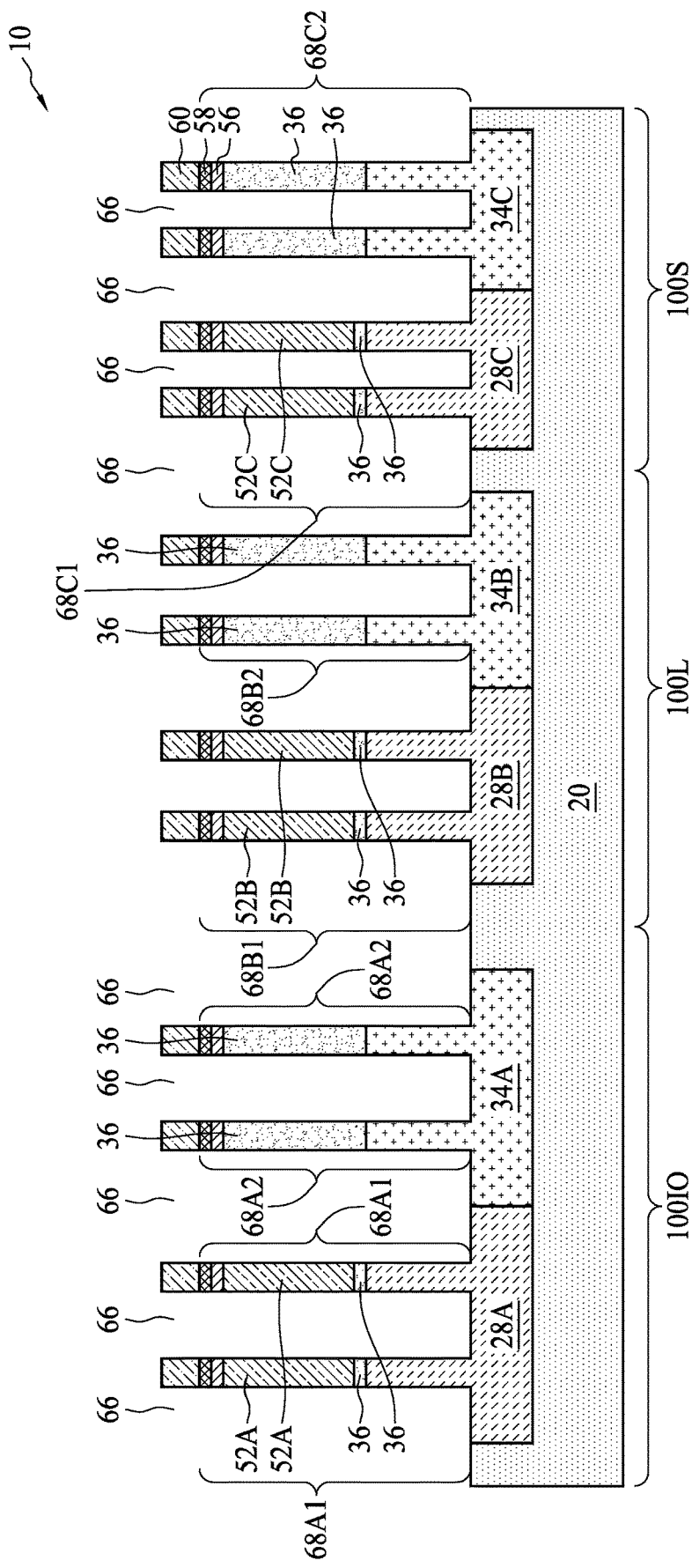

The layers underlying the patterned etching mask 62 are then etched through an anisotropic etching process, which may be a dry etching process. The respective process is illustrated as process 224 in the process flow shown in FIG. 18. The etching process may include several steps, each may use a different etch chemistry depending on the layer to be etched. After the etch process, etching mask 62 is removed. The resulting structure is shown in FIG. 13, which shows the formation of trenches 66, and semiconductor strips 68A1, 68A2, 68B1, 68B2, 68C1, and 68C2 (collectively referred to as semiconductor strips 68) in device regions 100IO, 100L, and 100S. The widths and spacing of the semiconductor strips 68A1 and 68A2 may be equal to or greater than the respective widths and spacings of semiconductor strips 68B1 and 68B2. The widths and spacing of the semiconductor strips 68B1 and 68B2 may be equal to or greater than the respective widths and spacings of semiconductor strips 68C1 and 68C2. The numbers of fins shown in FIG. 13 are examples and not limiting. Therefore, fewer or more semiconductor strips may be possible. In accordance with some embodiments, semiconductor strips 68A1, 68B1, and 68C1 may include the top portions of n-well regions 28A. 28B, and 28C, respectively, the bottom section of silicon epitaxy layer 36, and epitaxy regions 52A, 52B, and 52C, respectively. Semiconductor strips 68A2, 68B2, and 68C2 may include the top portions of p-well regions 34A. 34B, and 34C and portions of the epitaxy layer 36.

Reducing the top corner rounding and bottom corner rounding may reduce the undesirable encroaching of silicon and silicon germanium into each other's regions. For example, assuming a sidewall of epitaxy region 52B has the shape as shown as dashed line 70 in FIG. 12, the second semiconductor strips 68A1 (FIG. 13, counting from left) in FIG. 13 will include more silicon at bottom than desirable, and the first semiconductor strips 68A2 (counting from left) will undesirably have SiGe at the top. In accordance with some embodiments of the present disclosure, top corner rounding and bottom corner rounding are controlled so that all semiconductor strips have clear-cut profiles, as discussed in preceding paragraphs.

Figure 14:
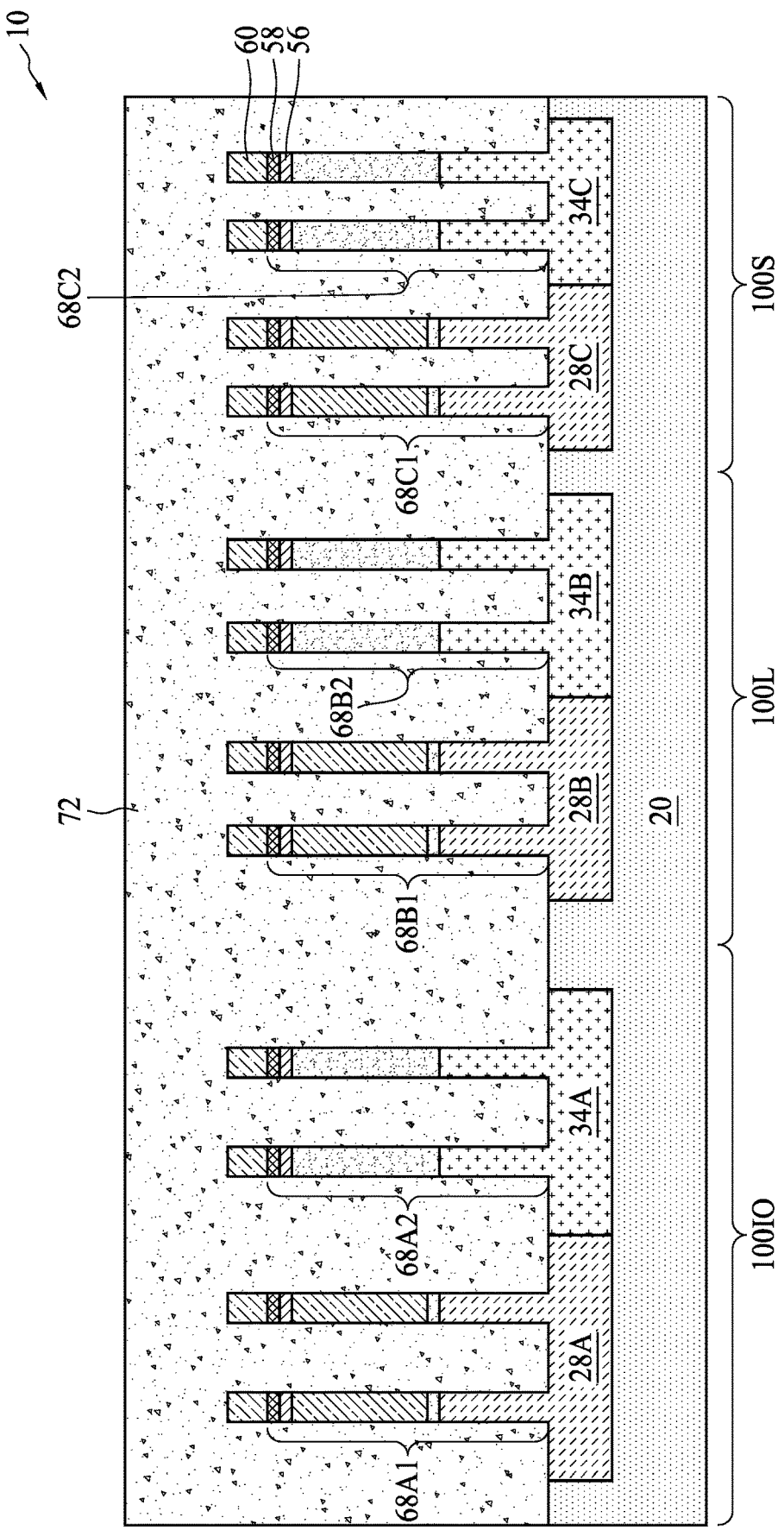

FIG. 14 illustrates the formation of dielectric layer 72, which fills trenches 66 in FIG. 13, and further covers the remaining portions of hard mask 60. The respective process is illustrated as process 226 in the process flow shown in FIG. 18. In accordance with some embodiments, dielectric layer 72 includes a liner, which may include a silicon oxide liner, a nitride liner, or combinations thereof. Another dielectric material is then deposited to fully fill trenches 66. The dielectric material may be formed using, for example, Flowable Chemical Vapor Deposition (FCVD). A CMP process may be performed to planarize the top surface of dielectric layer 72.

Figure 15:
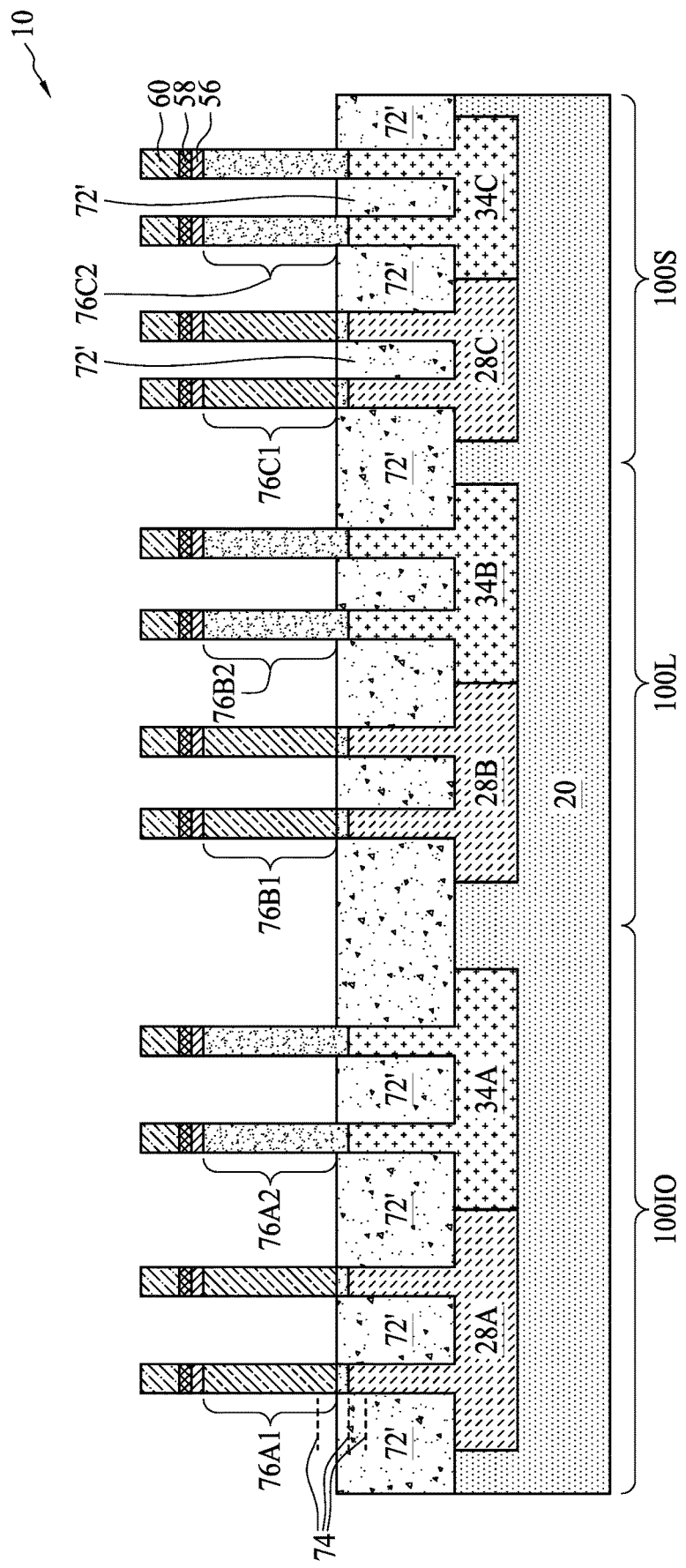

Next, as shown in FIG. 15, dielectric layer 72 is recessed, for example, in an etch-back process. The respective process is illustrated as process 228 in the process flow shown in FIG. 18. The remaining portions of dielectric layer 72 are referred to as Shallow Trench Isolation (STI) regions 72'. The top surface of STI regions 72' may be at the top surface level of epitaxy layer 36, as illustrated in FIG. 15, or may be at any of the levels shown with dashed lines 74. Semiconductor fins 76A1, 76A2, 76B1, 76B2, 76C1, and 76C2 are thus formed. Semiconductor fins 76A1, 76B1, and 76C1 are silicon germanium fins for forming p-type FinFETs in accordance with some embodiments, and semiconductor fins 76A2, 76B2, and 76C2 are silicon fins for forming n-type FinFETs in accordance with some embodiments. Having the top surfaces of STI regions 72' at different levels may result in the FinFETs to have different performance, depending on the requirements of the circuit. Accordingly, it is desirable to have small TCRs and BCRs, so that the performance of the FinFETs may be accurately controlled.

Figure 16:
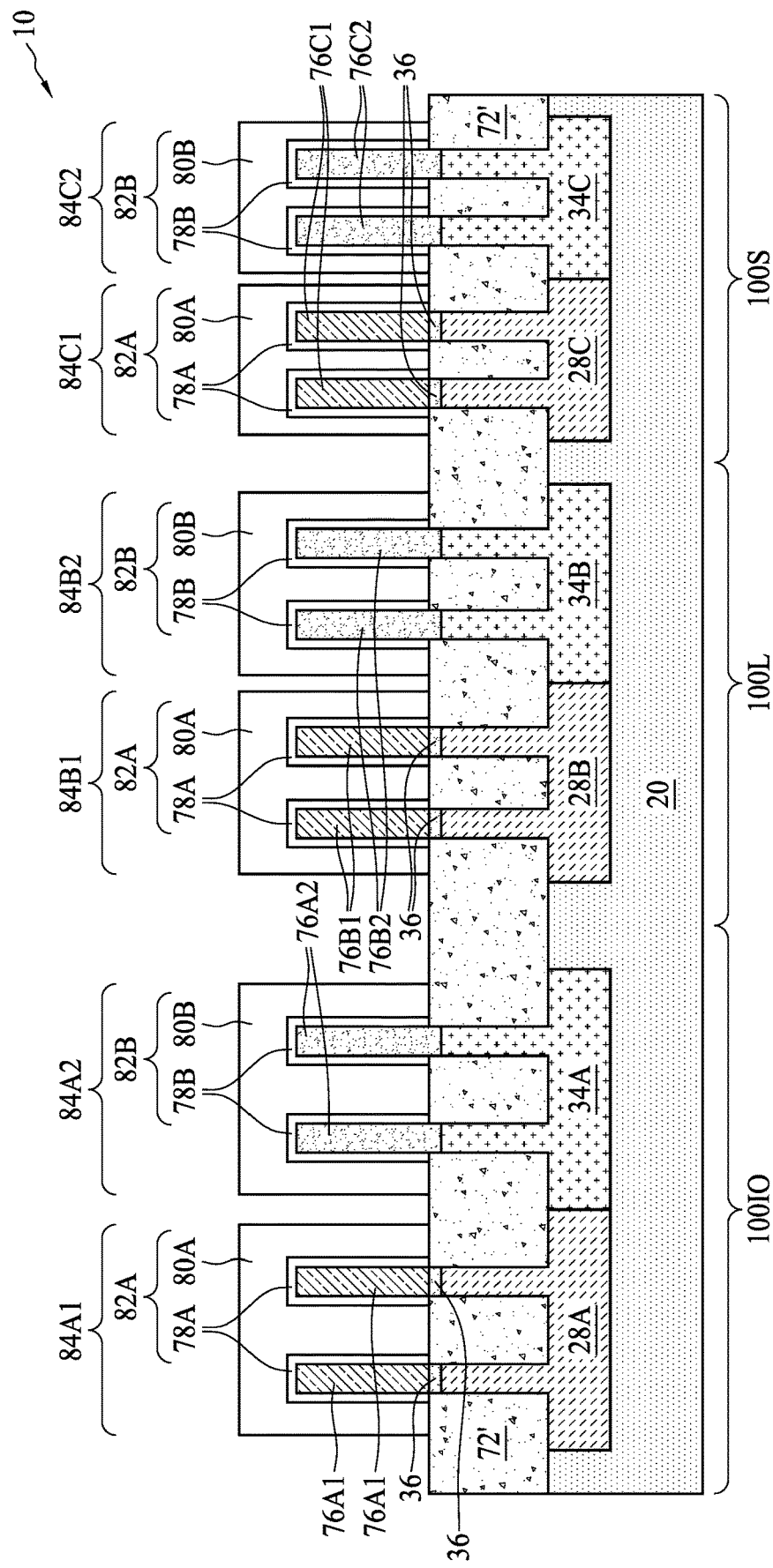
Figure 17:
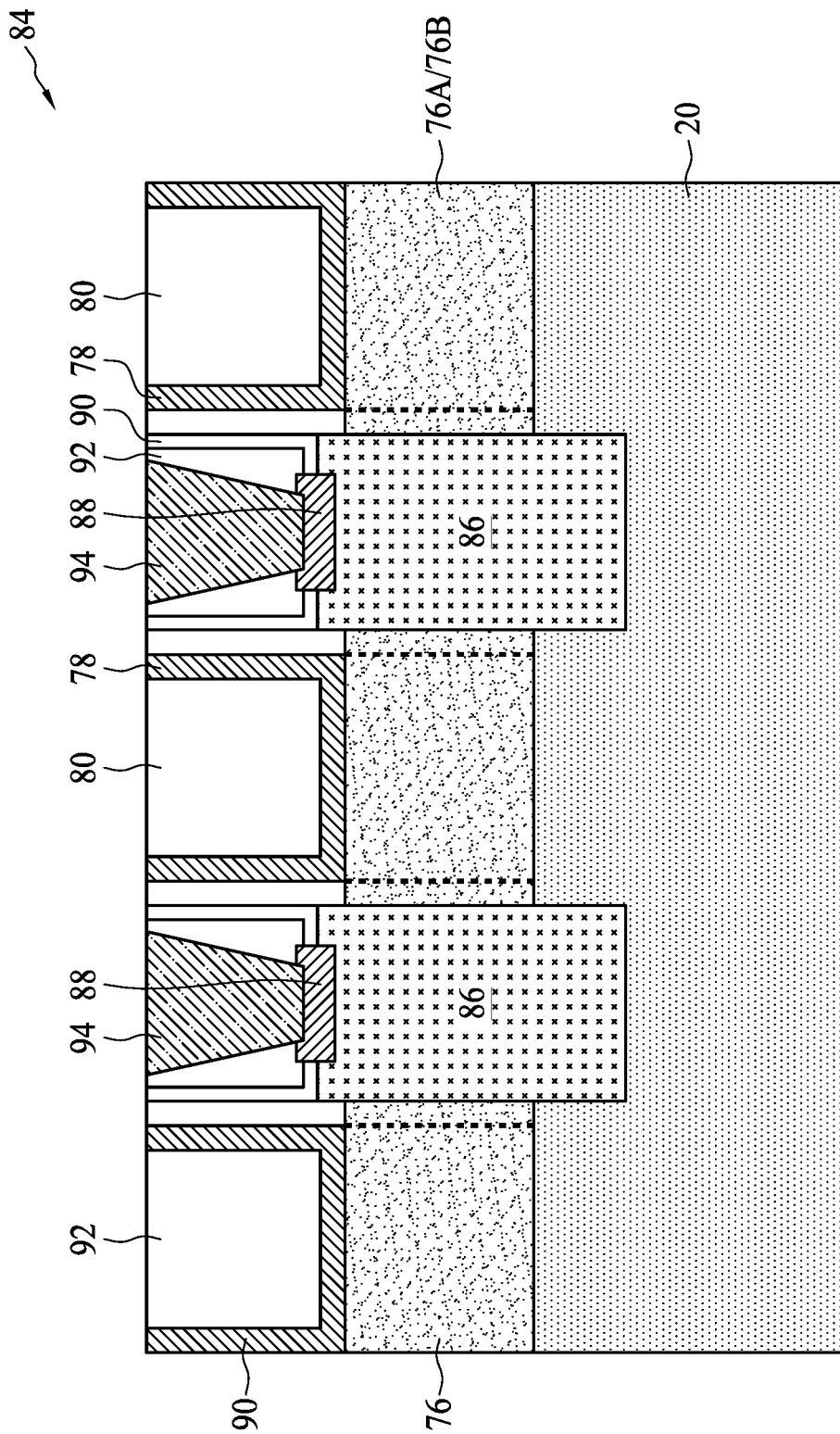
Figure 18:
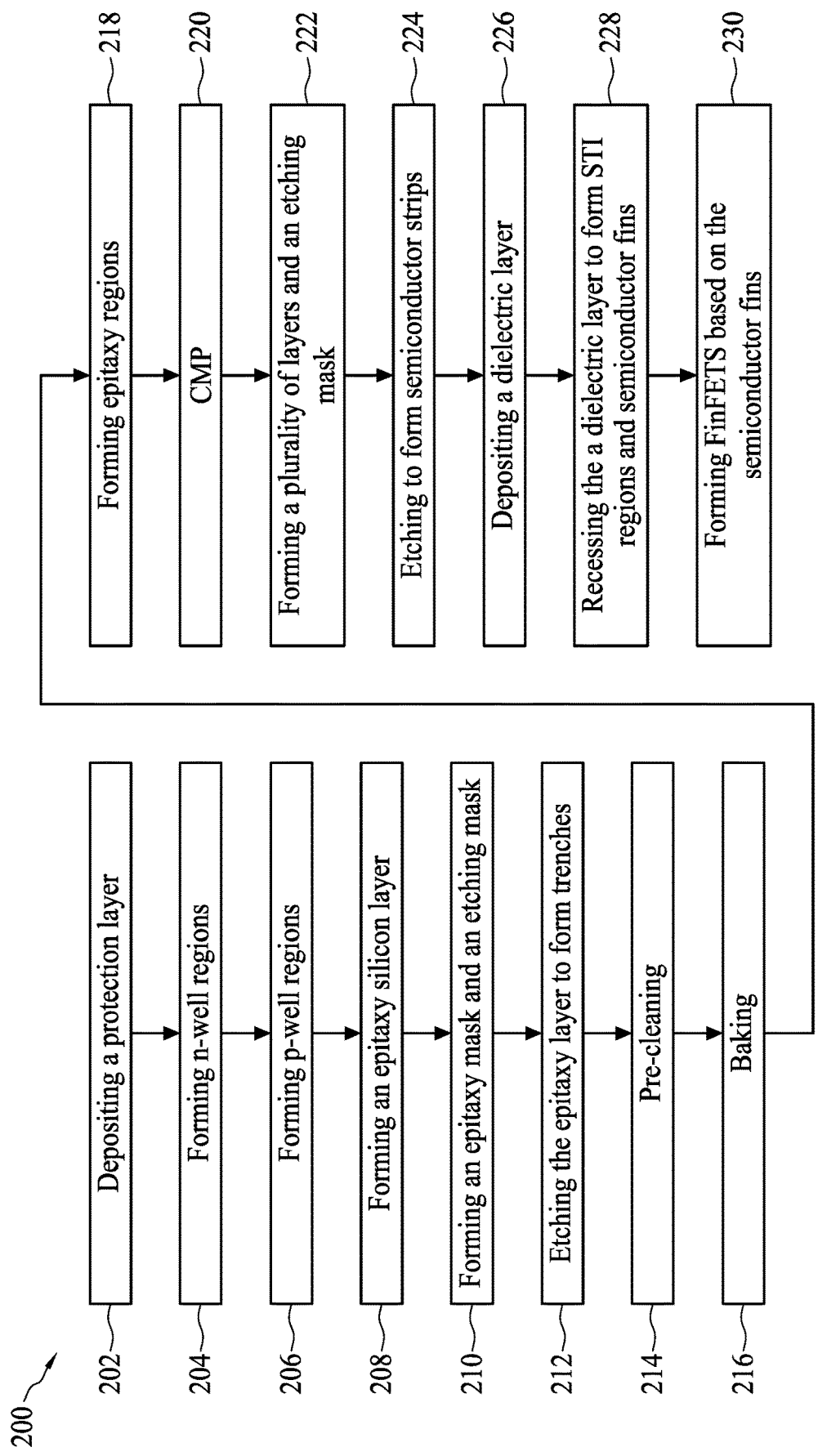
FIG. 18 illustrates a process flow for forming epitaxy regions and FinFETs in accordance with some embodiments.

FIG. 16 illustrates the formation of gate stacks 82A and 82B, hence forming FinFETs 84A1, 84A1, 84B1, 84B2, 84C1, and 84C2 in device regions 100IO, 100L, and 100S. The respective process is illustrated as process 230 in the process flow shown in FIG. 18. Gate stacks 82A and 82B may include gate dielectrics 78A and 78B, respectively, and gate electrodes 80A and 80B, respectively. FIG. 17 illustrate another cross-sectional view of the FinFET 84, which may be any of the FinFETs 84A and 84B. The cross-sectional view may be obtained from the vertical reference cross-section that passes any of the protruding fins in FIG. 17. FinFET 84 includes protruding fin 76A or 76B, which may be formed of SiGe or silicon, source/drain regions 86, source/drain silicide region 88, Contact Etch Stop Layer (CESL) 90, Inter-Layer Dielectric (ILD) 92, and source/drain contact plug 94. The details of these features are not discussed in detail herein.

The embodiments of the present disclosure have some advantageous features. By adjusting the loading of SiGe epitaxy regions in different device regions to have proper values, the top surfaces of the SiGe epitaxy regions in different device regions may be made coplanar. By controlling the profiles (such as top corner rounding values and bottom corner rounding values), the protruding fins for forming FinFETs are free from undesirable SiGe or silicon. Accordingly, the performance of whole-wafer p-type FinFETs and n-type FinFETs is more uniform.

In accordance with some embodiments of the present disclosure, a method comprises etching a silicon layer in a wafer to form a first trench in a first device region and a second trench in a second device region; performing a pre-clean process on the silicon layer; performing a baking process on the wafer; and performing an epitaxy process to form a first silicon germanium region and a second silicon germanium region in the first trench and the second trench, respectively, wherein the first silicon germanium region and the second silicon germanium region have a loading in a range between about 5 nm and about 30 nm. In an embodiment, each of the first silicon germanium region and the second silicon germanium region has a top corner rounding in a range between about 5 nm and about 10 nm, and a bottom corner rounding in a range between about 10 nm and about 20 nm. In an embodiment, the pre-clean process is performed in an ambient comprising hydrogen fluoride and hydrogen ($H_2$). In an embodiment, the pre-clean process is performed in an ambient comprising nitrogen trifluoride ($NF_3$), ammonia ($NH_3$), argon, and hydrogen ($H_2$). In an embodiment, the baking process is performed at a temperature in a range between about 750° C. and about 950° C. In an embodiment, the method further comprises performing a plurality of experiments, each comprising the etching the silicon layer and the epitaxy process, with different temperatures used in the epitaxy processes of the plurality of experiments to determine an optimum temperature for achieving the loading in the range between about 5 nm and about 30 nm. In an embodiment, the method further comprises performing a plurality of experiments, each comprising forming an epitaxy mask over the silicon layer, wherein the epitaxy masks of the plurality of experiments having different thicknesses, and wherein the plurality of experiments are performed to determine an optimum thickness of the epitaxy mask for achieving the loading in the range between about 5 nm and about 30 nm. In an embodiment, the plurality of experiments are performed using different temperatures for the epitaxy process to determine an optimum combination of an epitaxy temperature and the optimum thickness of the epitaxy mask for achieving the loading in the range between about 5 nm and about 30 nm. In an embodiment, the method further comprises forming a first FinFET based on the first silicon germanium region and a second FinFET in the second silicon germanium region, wherein the first FinFET is in an input/output device region, and the second FinFET is in a logic device region. In an embodiment, the method further comprises forming a first FinFET based on the first silicon germanium region and a second FinFET in the second silicon germanium region, wherein the first FinFET is in a logic device region, and the second FinFET is in a static random access memory device region.

In accordance with some embodiments of the present disclosure, a method comprises performing a first epitaxy process to deposit a silicon layer on a semiconductor wafer, wherein the semiconductor wafer comprises an input/output (IO) device region, a logic device region, and a memory device region; etching the silicon layer to form a first trench, a second trench, and a third trench extending into the silicon layer, wherein the first trench, the second trench, and the third trench are in the IO device region, the logic device region, and the memory device region, respectively; and performing a second epitaxy process to form a first silicon germanium region, a second silicon germanium region, and a third silicon germanium region in the first trench, the second trench, and the third trench, respectively, wherein a first top surface of the first silicon germanium region is lower than a second top surface of the second silicon germanium region by a first height difference, and the second top surface of the second silicon germanium region is lower than a third top surface of the third silicon germanium region by a second height difference. In an embodiment, both of the first height difference and the second height difference are in a range between about 5 nm and about 30 nm. In an embodiment, the method further comprises performing a polishing process on the first silicon germanium region, the second silicon germanium region, and the third silicon germanium region, wherein differences in polishing rates of the first silicon germanium region, the second silicon germanium region, and the third silicon germanium region fully compensate for the first height difference and the second height difference at a time a top surface of the silicon layer is revealed by the polishing process. In an embodiment, each of the first silicon germanium region, the second silicon germanium region, and the third silicon germanium region has a top corner rounding and a bottom corner rounding, and wherein the bottom corner rounding is greater than the top corner rounding. In an embodiment, the top corner rounding is smaller than a half of the bottom corner rounding. In an embodiment, the bottom corner rounding is smaller than about 20 percent of a thickness of the first silicon germanium region.

In accordance with some embodiments of the present disclosure, a method comprises forming a patterned epitaxy mask over a silicon layer; etching the silicon layer to form a first trench and a second trench extending into the silicon layer; performing an epitaxy process to form a first silicon germanium region and a second silicon germanium region in the first trench and the second trench, respectively, wherein a first top surface of the first silicon germanium region is lower than a second top surface of the second silicon germanium region by a height difference; and performing a planarization process to remove the patterned epitaxy mask and top portions of the first silicon germanium region and the second silicon germanium region, wherein in the planarization process, the first silicon germanium region has a first polishing rate lower than a second polishing rate of the second silicon germanium region by a polishing rate difference, and wherein at a time the patterned epitaxy mask is fully removed and a third top surface of the silicon layer is exposed, the height difference is fully compensated for by the polishing rate difference. In an embodiment, the height difference is in a range between about 5 nm and about 30 nm. In an embodiment, the method further comprises patterning the first silicon germanium region and the second silicon germanium region to form first silicon germanium fins and second silicon germanium fins, respectively; and forming a first FinFET and a second FinFET based on the first silicon germanium fins and the second silicon germanium fins, respectively. In an embodiment, the first FinFET is in a logic device, and the second FinFET is in a static random access memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a semiconductor layer in a wafer to form a first trench in a first device region and a second trench in a second device region;
   performing a pre-clean process on the wafer;
   performing a baking process on the wafer at a first temperature; and
   performing an epitaxy process to form a first silicon germanium region and a second silicon germanium region in the first trench and the second trench, respectively, wherein the epitaxy process is performed at a second temperature lower than the first temperature.

2. The method of claim 1, wherein in the first trench is wider than the second trench, and the first silicon germanium region has a first top surface lower than a second top surface of the second silicon germanium region by a difference, and where the method further comprises performing a planarization process on the first silicon germanium region and the second silicon germanium region, wherein the difference between top surfaces of the first silicon germanium region and the second silicon germanium region is reduced.

3. The method of claim 2, wherein bottoms of the first trench and the second trench are substantially coplanar with each other.

4. The method of claim 2, wherein the difference between the top surfaces of the first silicon germanium region and the second silicon germanium region is eliminated by the planarization process.

5. The method of claim 1, wherein the first silicon germanium region and the second silicon germanium region have a loading in a range between 5 nm and 30 nm, and wherein each of the first silicon germanium region and the second silicon germanium region has a top corner rounding in a range between 5 nm and 10 nm, and a bottom corner rounding in a range between 10 nm and 20 nm.

6. The method of claim 1, wherein the first temperature is in a range between 750° C. and 950° C.

7. The method of claim 1, wherein the second temperature is in a range between 600° C. and 700° C.

8. The method of claim 1, wherein the pre-clean process is performed in an ambient comprising hydrogen fluoride and hydrogen ($H_2$).

9. The method of claim 1, wherein the pre-clean process is performed in an ambient comprising nitrogen trifluoride ($NF_3$), ammonia ($NH_3$), argon, and hydrogen ($H_2$).

10. The method of claim 1 further comprising forming a first Fin Field-Effect Transistor (FinFET) based on the first silicon germanium region and a second FinFET based on the second silicon germanium region, wherein the first FinFET is in an input/output transistor, and the second FinFET is in a logic transistor.

11. The method of claim 1 further comprising forming a first Fin Field-Effect Transistor (FinFET) based on the first silicon germanium region and a second FinFET based on the second silicon germanium region, wherein the first FinFET is a logic transistor, and the second FinFET is a static random-access memory device transistor.

12. A method comprising:
    performing a first epitaxy process to deposit a silicon layer on a semiconductor wafer;
    etching the silicon layer to form a first trench, a second trench, and a third trench extending into the silicon layer, wherein the first trench is wider than the first trench, and the second trench is wider than the first trench;
    performing a second epitaxy process to form a first silicon germanium region, a second silicon germanium region, and a third silicon germanium region in the first trench, the second trench, and the third trench, respectively, wherein a first top surface of the first silicon germanium region, a second top surface of the second silicon germanium region, and a third top surface of the third silicon germanium region have height differences; and
    performing a planarization process, wherein in the planarization process, the height differences are eliminated.

13. The method of claim 12, wherein the first top surface is lower than the second top surface, and the second top surface is lower than the third top surface, and wherein the first silicon germanium region has a first planarization rate, the second silicon germanium region has a second planarization rate higher than the first planarization rate, and the third silicon germanium region has a third planarization rate higher than the second planarization rate.

14. The method of claim 12, wherein each of the first silicon germanium region, the second silicon germanium region, and the third silicon germanium region has a top corner rounding and a bottom corner rounding, and wherein the bottom corner rounding is greater than the top corner rounding.

15. The method of claim 14, wherein the top corner rounding is smaller than a half of the bottom corner rounding.

16. The method of claim 14, wherein the bottom corner rounding is smaller than 20 percent of a thickness of the first silicon germanium region.

17. A method comprising:
    forming a patterned epitaxy mask over a silicon layer of a wafer;

etching the silicon layer to form a first trench and a second trench extending into the silicon layer;

after the etching, performing a baking process on the wafer at a first temperature;

performing an epitaxy process to form a first silicon germanium region and a second silicon germanium region in the first trench and the second trench, respectively, wherein the epitaxy process is performed at a second temperature lower than the first temperature; and performing a planarization process to remove the patterned epitaxy mask and top portions of the first silicon germanium region and the second silicon germanium region, wherein in the planarization process, the first silicon germanium region has a first polishing rate lower than a second polishing rate of the second silicon germanium region.

18. The method of claim 17 further comprising:

forming an input-output transistor based on the first silicon germanium region; and forming a logic transistor based on the second silicon germanium region.

19. The method of claim 17 further comprising:

forming an input-output transistor based on the first silicon germanium region; and forming a static random-access memory device based on the second silicon germanium region.

20. The method of claim 17 further comprising, at a time after the baking process and before the epitaxy process, performing a thinning process to thin the patterned epitaxy mask.

* * * * *